(12) United States Patent
Jung

(10) Patent No.: US 9,698,259 B2
(45) Date of Patent: Jul. 4, 2017

(54) SEMICONDUCTOR DEVICES INCLUDING PATTERNS IN A SOURCE REGION

(71) Applicant: JaeHyun Jung, Suwon-si (KR)

(72) Inventor: JaeHyun Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/939,904

(22) Filed: Nov. 12, 2015

(65) Prior Publication Data

US 2016/0149031 A1   May 26, 2016

(30) Foreign Application Priority Data

Nov. 21, 2014   (KR) .......................... 10-2014-0163384

(51) Int. Cl.
| | | |
|---|---|---|
| *H01L 29/08* | (2006.01) | |
| *H01L 29/78* | (2006.01) | |
| *H01L 29/06* | (2006.01) | |
| *H01L 29/10* | (2006.01) | |
| *H01L 29/66* | (2006.01) | |

(52) U.S. Cl.
CPC ...... *H01L 29/7816* (2013.01); *H01L 29/0653* (2013.01); *H01L 29/0696* (2013.01); *H01L 29/0869* (2013.01); *H01L 29/1095* (2013.01); *H01L 29/66659* (2013.01); *H01L 29/66681* (2013.01); *H01L 29/7835* (2013.01); *H01L 29/665* (2013.01); *H01L 29/7848* (2013.01)

(58) Field of Classification Search
CPC ............. H01L 29/0856; H01L 29/0865; H01L 29/7816

USPC .................................................. 257/343, 401
See application file for complete search history.

(56) References Cited

U.S. PATENT DOCUMENTS

| | | | |
|---|---|---|---|
| 7,315,067 B2 | 1/2008 | Wang | |
| 7,462,906 B2 | 12/2008 | Lu et al. | |
| 7,476,591 B2 | 1/2009 | Huang et al. | |
| 7,741,661 B2 | 6/2010 | Disney et al. | |
| 8,004,038 B2 | 8/2011 | Chien et al. | |
| 8,008,687 B2 | 8/2011 | Tu et al. | |
| 8,063,445 B2 | 11/2011 | Kato et al. | |
| 8,293,614 B2 | 10/2012 | Chu et al. | |
| 8,362,556 B2 | 1/2013 | Cha et al. | |
| 8,546,881 B2 | 10/2013 | Cha et al. | |
| 8,928,078 B2 * | 1/2015 | Kao ................. | H01L 29/7816 257/343 |
| 8,963,243 B2 | 2/2015 | Park et al. | |
| 2009/0140372 A1 | 6/2009 | Hodel et al. | |
| 2013/0062692 A1 | 3/2013 | Chen et al. | |
| 2013/0270636 A1 | 10/2013 | Ito | |
| 2014/0030861 A1 | 1/2014 | Camillo-Castillo et al. | |
| 2014/0035033 A1 | 2/2014 | Lim el al. | |

* cited by examiner

Primary Examiner — Mark Prenty
(74) Attorney, Agent, or Firm — Myers Bigel, P.A.

(57) ABSTRACT

Semiconductor devices are provided. A semiconductor device includes a substrate including a well region. The semiconductor device includes a source region in the well region. The semiconductor device includes a drain region. The semiconductor device includes a gate electrode that is between the source and drain regions, when viewed in a plan view. Moreover, the semiconductor device includes first and second patterns, in the source region, that are spaced apart from each other when viewed in the plan view.

19 Claims, 45 Drawing Sheets

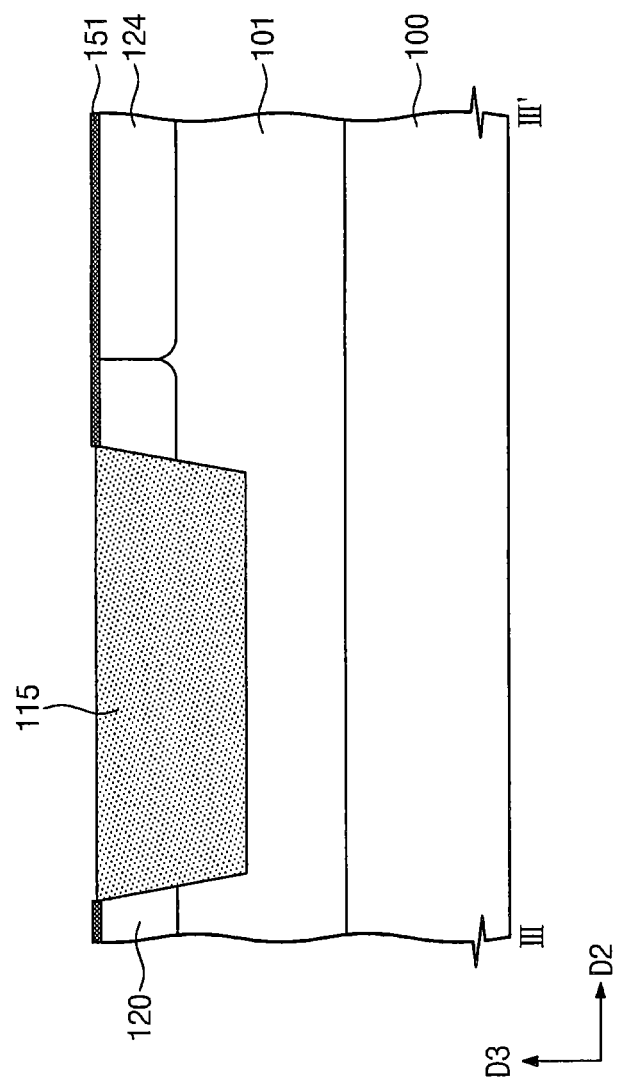

SEMICONDUCTOR DEVICES INCLUDING PATTERNS IN A SOURCE REGION

CROSS-REFERENCE TO RELATED APPLICATION

This U.S. non-provisional patent application claims priority under 35 U.S.C. §119 to Korean Patent Application No. 10-2014-0163384, filed on Nov. 21, 2014, in the Korean Intellectual Property Office, the entire contents of which are hereby incorporated herein by reference.

BACKGROUND

The present disclosure relates to semiconductor devices. Semiconductor devices are electronic components that exploit the electronic properties of semiconductor materials such as silicon, germanium, and gallium arsenide. These devices can be classified into, for example, memory devices to store data and logic devices to operate data or execute predetermined commands for the applications of electronic components.

In the semiconductor industry, miniaturization, multi-functionalization, and/or high speed for semiconductor devices are increasingly becoming significant. With such advances in electronic industries, there are ever-increasing demands for high integration density, multi-functionalization, high speed, reproducibility, and/or high reliability of semiconductor devices. It is recognized that traditional approaches may not adequately address the demands because trade-off may arise between these characteristics, so there may be difficulty in satisfying all of the demands. For example, a decrease in feature size and/or distance of semiconductor patterns may make it difficult to increase operation speed of semiconductor devices and achieve reliability and/or reproducibility of semiconductor devices. Consequently, this may negatively impact the satisfaction of various requirements for semiconductor devices.

SUMMARY

Example embodiments of present inventive concepts may provide a high voltage transistor configured to selectively reduce on-resistance, without any significant change in other electrical characteristics (e.g., breakdown voltage).

According to example embodiments of the inventive concept, a semiconductor device may include a substrate including a well region. The semiconductor device may include a gate electrode on the substrate. The semiconductor device may include source and drain regions in the substrate and including a first conductivity type opposite a second conductivity type of the well region, the source region being in the well region and the drain region being spaced apart from the source region, with the gate electrode between the source region and the drain region. The semiconductor device may include a plurality of gapfill patterns arranged along the source region and spaced apart from each other, when viewed in a plan view. Moreover, the semiconductor device may include a well contact region in the well region and including the second conductivity type, and the well contact region may directly contact the source region.

In various embodiments, the gapfill patterns may be configured to exert a compressive stress on a channel region between the source and drain regions. In some embodiments, when viewed in the plan view, each of the gapfill patterns may be surrounded by the source region. In some embodiments, at least one of the gapfill patterns may be at least partially in the well region. In some embodiments, the well region may be on a bottom surface, and portions of side surfaces, of each of the gapfill patterns. In some embodiments, the gapfill patterns may include silicon oxide that fills trenches that are in the substrate. Moreover, in some embodiments, the gapfill patterns may include silicon germanium that fills trenches that are in the substrate.

According to various embodiments, the gate electrode, the source region, and the drain region may extend in a direction parallel to a top surface of the substrate, and the gapfill patterns may be spaced apart from each other in the direction. In some embodiments, when viewed in the plan view, the gapfill patterns may be spaced apart from the gate electrode. In some embodiments, the drain region may be in the well region. Moreover, in some embodiments, the semiconductor device may include a gate insulating layer between the substrate and the gate electrode, where the first conductivity type may be p-type and the second conductivity type may be n-type.

In various embodiments, the semiconductor device may include a drift region in the substrate and between the well region and the drain region, where the drift region may have the first conductivity type, and where the drain region may be enclosed by the drift region. In some embodiments, the semiconductor device may include an insulating isolation layer in the drift region and between the drain region and the well region. In some embodiments, the insulating isolation layer may include a bottom surface overlapping the drift region. In some embodiments, the insulating isolation layer and the gapfill patterns may include respective bottom surfaces that are substantially equidistant from a surface of the substrate. In some embodiments, the gate electrode may partially overlap the insulating isolation layer. In some embodiments, the gate electrode, the source region, the drain region, and the insulating isolation layer may extend in a direction parallel to a top surface of the substrate, and the gapfill patterns may be spaced apart from each other in the direction. Moreover, the gapfill patterns may be laterally spaced apart from the drift region.

A semiconductor device, according to various embodiments, may include a substrate including a well region. The semiconductor device may include a gate electrode on the substrate. The semiconductor device may include first and second source regions in the well region. The semiconductor device may include a drain region in the substrate and spaced apart from the first and second source regions, with the gate electrode between the drain region and the first and second source regions. The semiconductor device may include a well contact region in the well region and between the first and second source regions. Moreover, the semiconductor device may include a plurality of gapfill patterns spaced apart from each other adjacent the well contact region, when viewed in a plan view. The first and second source regions and the drain region may have a first conductivity type different from a second conductivity type of the well region and the well contact region, and the well contact region may directly contact both of the first and second source regions.

In various embodiments, the gapfill patterns may be between the first and second source regions. In some embodiments, when viewed in the plan view, the gapfill patterns may be bordered by the well contact region. In some embodiments, the well contact region may include a plurality of well contact regions, and, when viewed in the plan view, the gapfill patterns and the well contact regions may be alternatingly disposed between the first and second source regions. In some embodiments, at least one of the gapfill patterns may partially overlap the first or second source region, when viewed in the plan view.

According to various embodiments, the gapfill patterns may include silicon oxide that fills trenches that are in the substrate. In some embodiments, the gapfill patterns may include silicon germanium that fills trenches that are in the substrate. In some embodiments, the gate electrode, the first and second source regions, and the drain region may extend in a direction parallel to a top surface of the substrate, and the gapfill patterns may be spaced apart from each other in the direction. In some embodiments, when viewed in the plan view, the gapfill patterns may be spaced apart from the gate electrode. In some embodiments, the drain region may be in the well region. Moreover, in some embodiments, the semiconductor device may include a gate insulating layer between the substrate and the gate electrode, where the first conductivity type of the first and second source regions and the drain region may be p-type and the second conductivity type of the well region and the well contact region may be n-type.

In various embodiments, the semiconductor device may include a drift region in the substrate and between the well region and the drain region, where the drift region may have the first conductivity type, and where the drain region may be enclosed by the drift region. In some embodiments, the semiconductor device may include an insulating isolation layer in the drift region and between the drain region and the well region. In some embodiments, the insulating isolation layer may have a bottom surface overlapping the drift region. In some embodiments, the insulating isolation layer and the gapfill patterns may have respective bottom surfaces that are substantially equidistant from a surface of the substrate. In some embodiments, the gate electrode may partially overlap the insulating isolation layer. In some embodiments, the gate electrode, the first and second source regions, the drain region, and the insulating isolation layer may extend in a direction parallel to a top surface of the substrate, and the gapfill patterns may be spaced apart from each other in the direction. Moreover, in some embodiments, the gapfill patterns may be laterally spaced apart from the drift region.

A semiconductor device, according to various embodiments, may include a substrate including a well region and a drain region. The semiconductor device may include a source region in the well region. The semiconductor device may include a gate electrode that is between the source and drain regions, when viewed in a plan view. Moreover, the semiconductor device may include first and second patterns, in the source region, that are spaced apart from each other when viewed in the plan view.

In various embodiments, the source and drain regions may include p-type source and drain regions, and the well region may include an n-type well region. Moreover, the semiconductor device may include an n-type well contact region, in the n-type well region, that directly contacts the p-type source region, and the first and second patterns may be configured to exert a compressive stress on a channel region between the p-type source and drain regions.

According to various embodiments, respective perimeters of the first and second patterns may be surrounded by the p-type source region and/or the n-type well contact region, when viewed in the plan view. In some embodiments, the semiconductor device may include a drift region between the well region and the drain region, and may include an insulating isolation layer in the drift region and between the drain region and the well region. Moreover, in some embodiments, the source region may include first and second source regions, and the first and second patterns may be between the first and second source regions, when viewed in the plan view.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 2B, 3B, 4B, 5B, 6B, and 7I are sectional views taken along line II-II' of FIG. 1A to illustrate a method of fabricating a semiconductor device, according to some example embodiments of present inventive concepts.

FIGS. 2C, 3C, 4C, 5C, 6C, and 7C are sectional views taken along line III-III' of FIG. 1A to illustrate a method of fabricating a semiconductor device, according to some example embodiments of present inventive concepts.

Figure 1A:
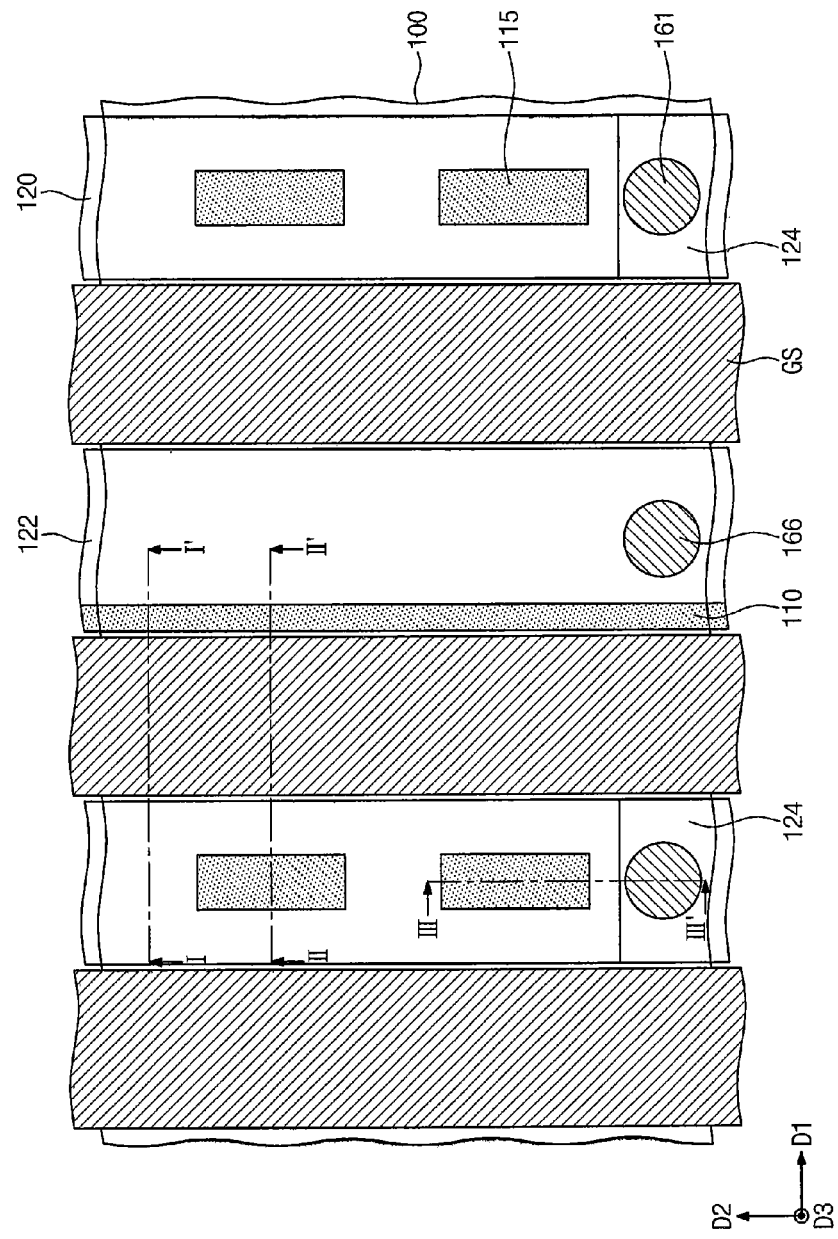
FIG. 1A is a schematic plan view of a semiconductor device according to some example embodiments of present inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

[Example Embodiments: P-LDMOS]

Figure 1B:
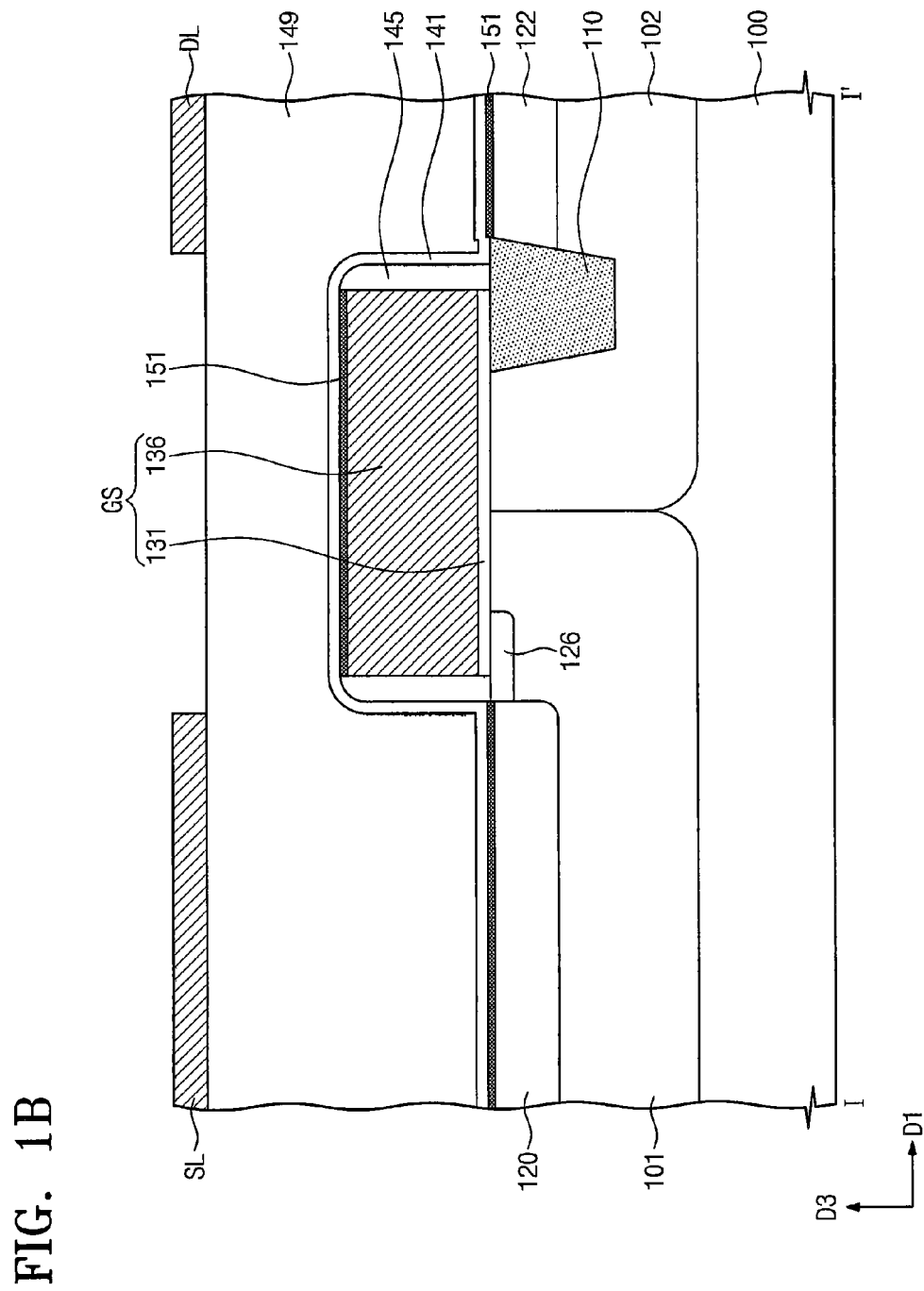
FIGS. 1B through 1D are sectional views, which illustrate vertical sections taken along lines I-I', II-II', and III-III', respectively, of FIG. 1A.
Figure 1C:
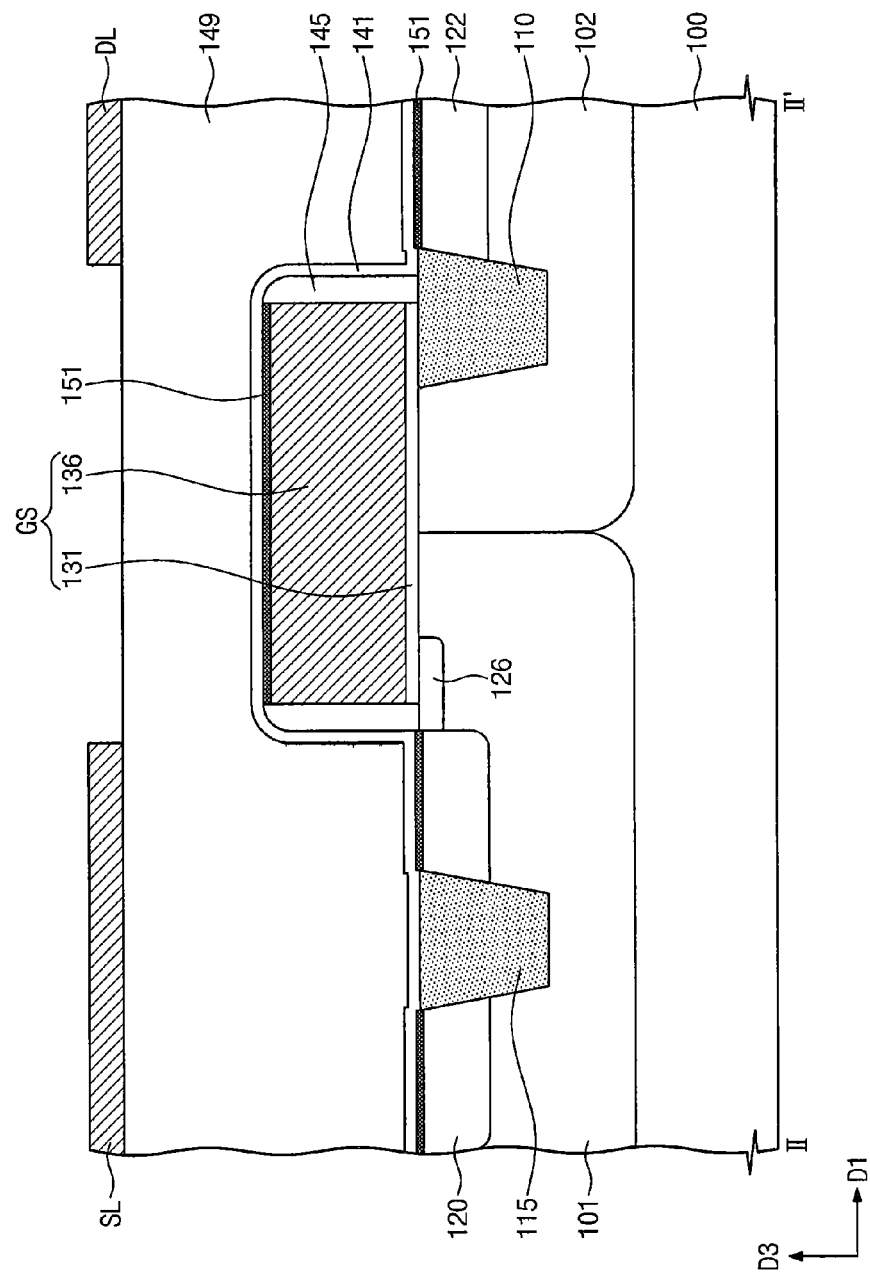
Figure 1D:
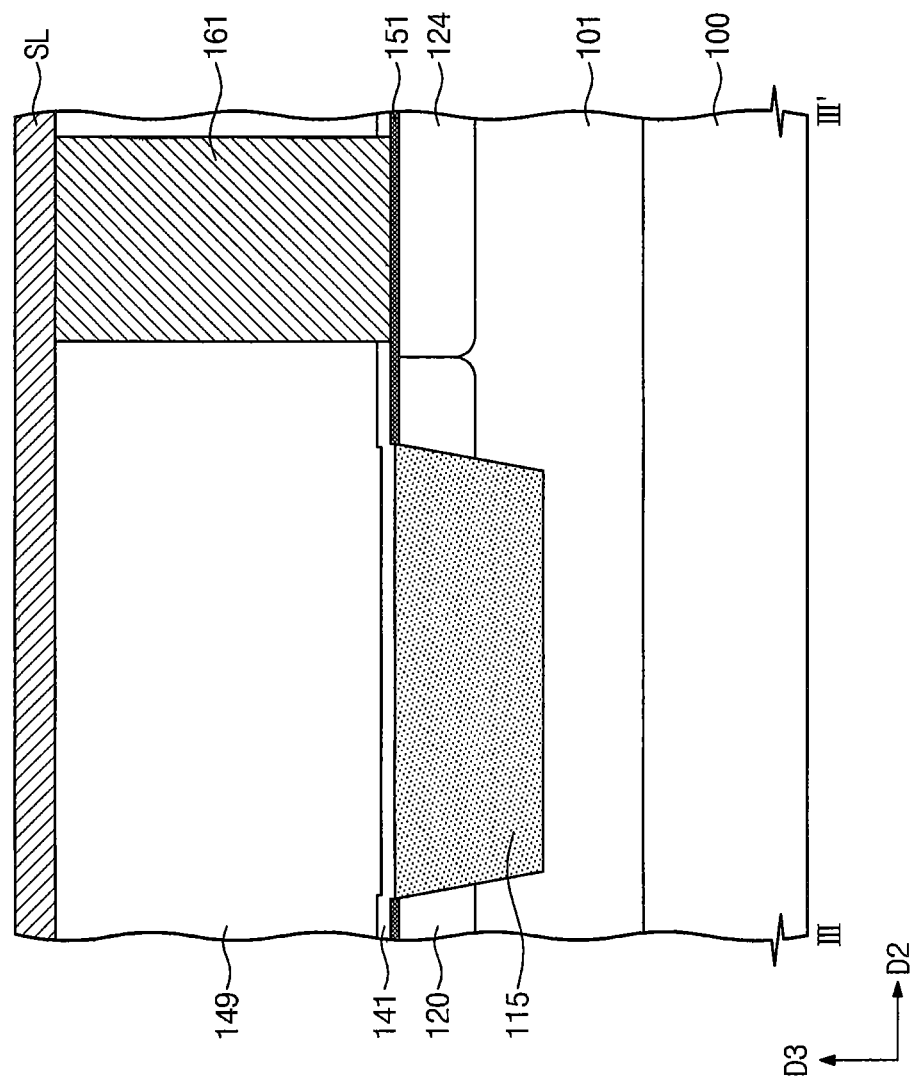
Figure 2A:
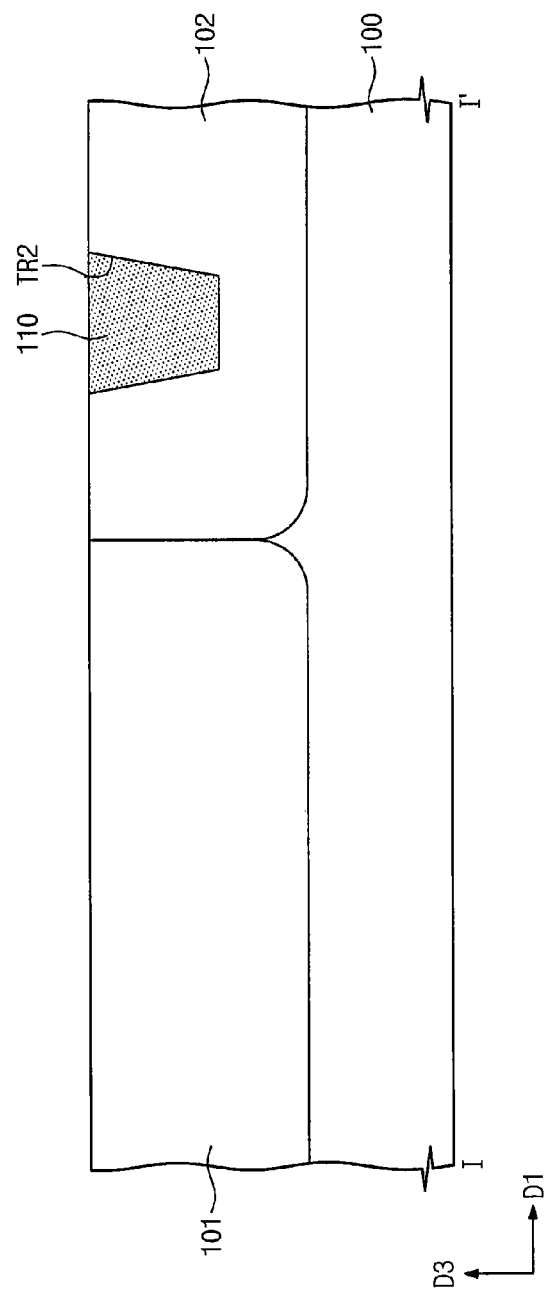
FIGS. 2A, 3A, 4A, 5A, 6A, and 7A are sectional views taken along line I-I' of FIG. 1A to illustrate a method of fabricating a semiconductor device, according to some example embodiments of present inventive concepts.
Figure 2B:
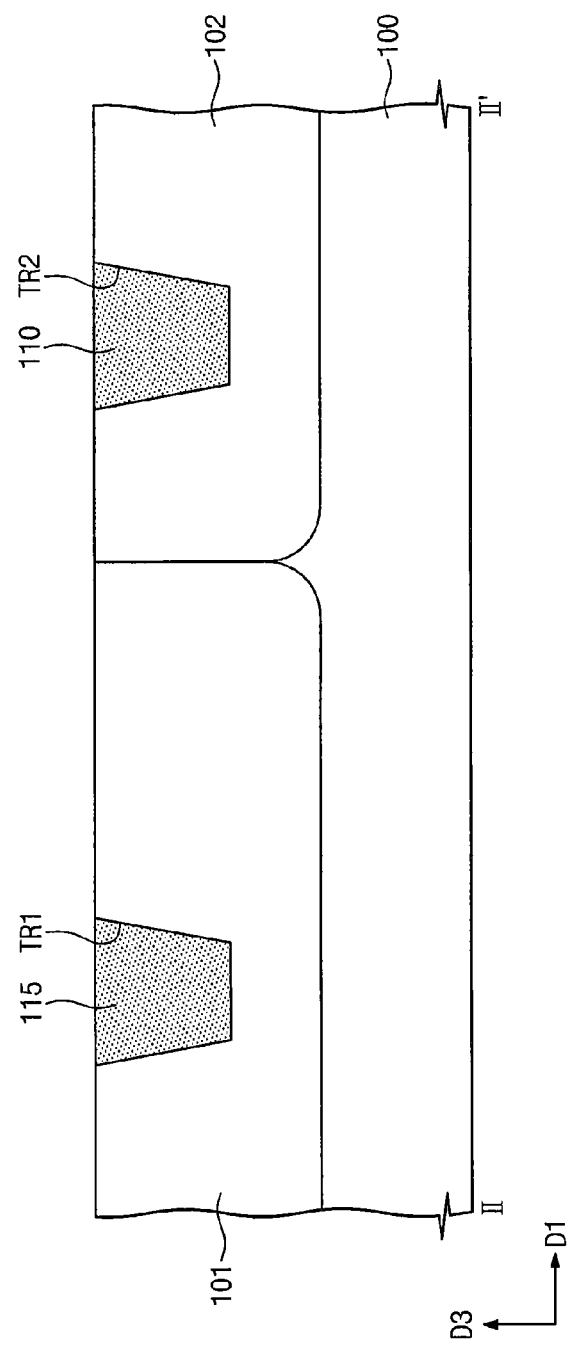
Figure 2C:
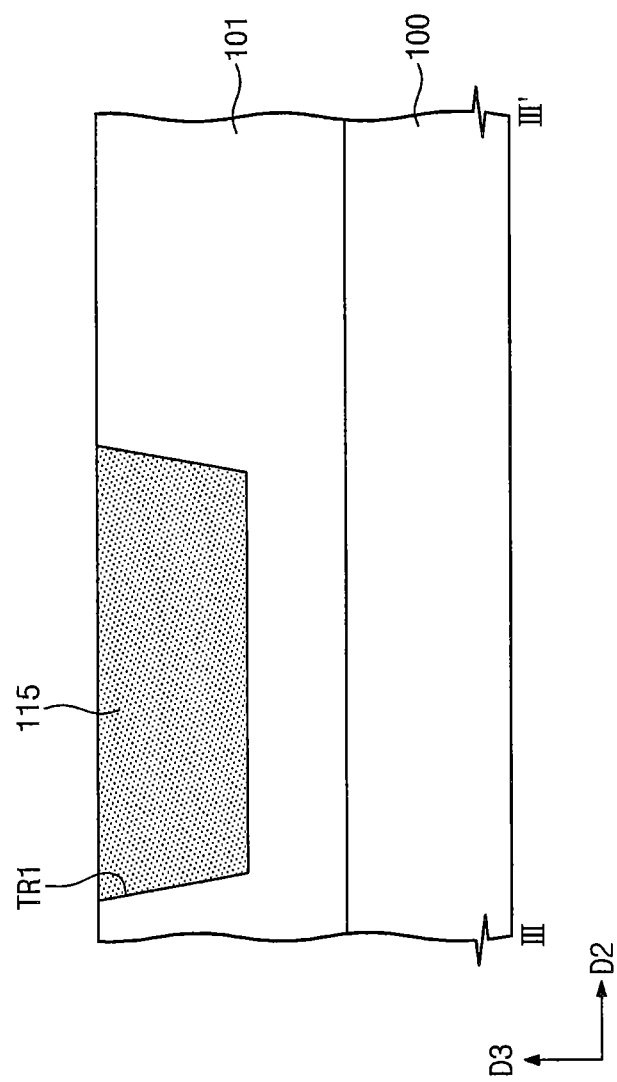
Figure 3A:
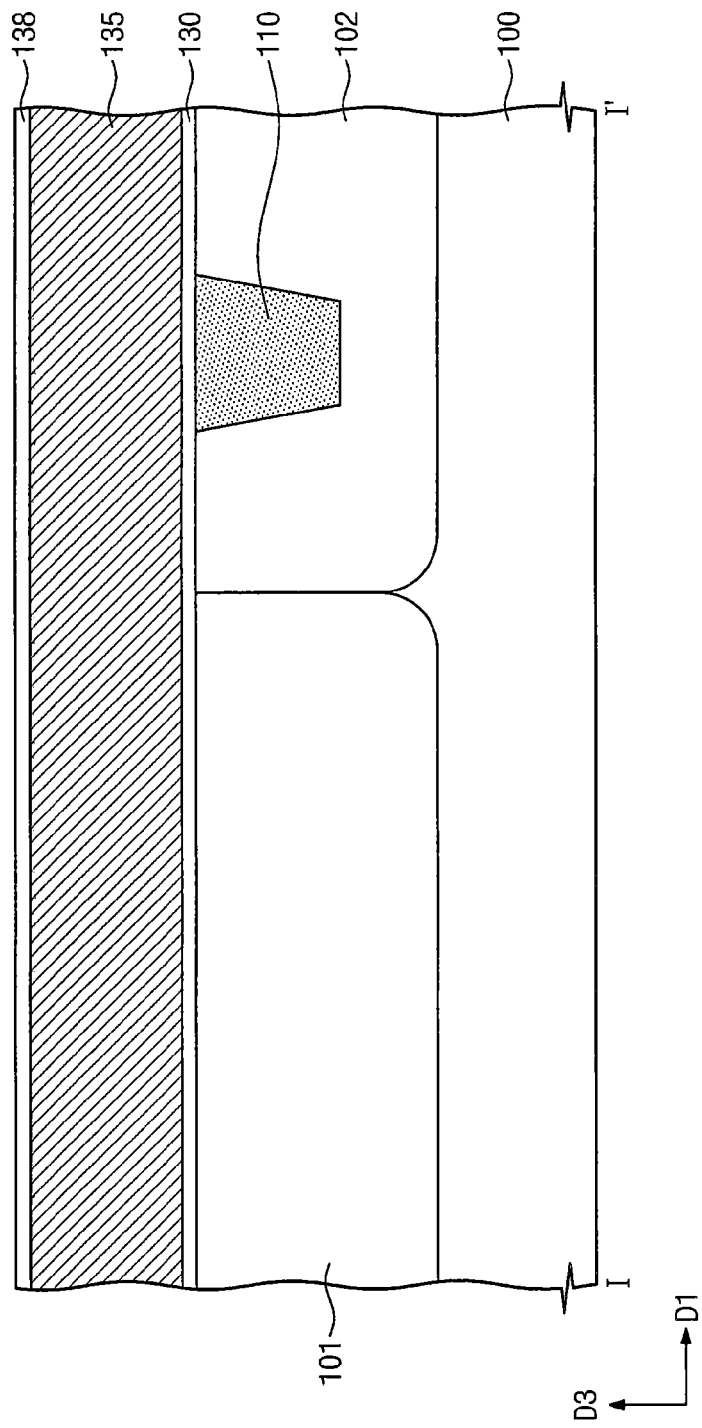
Figure 3B:
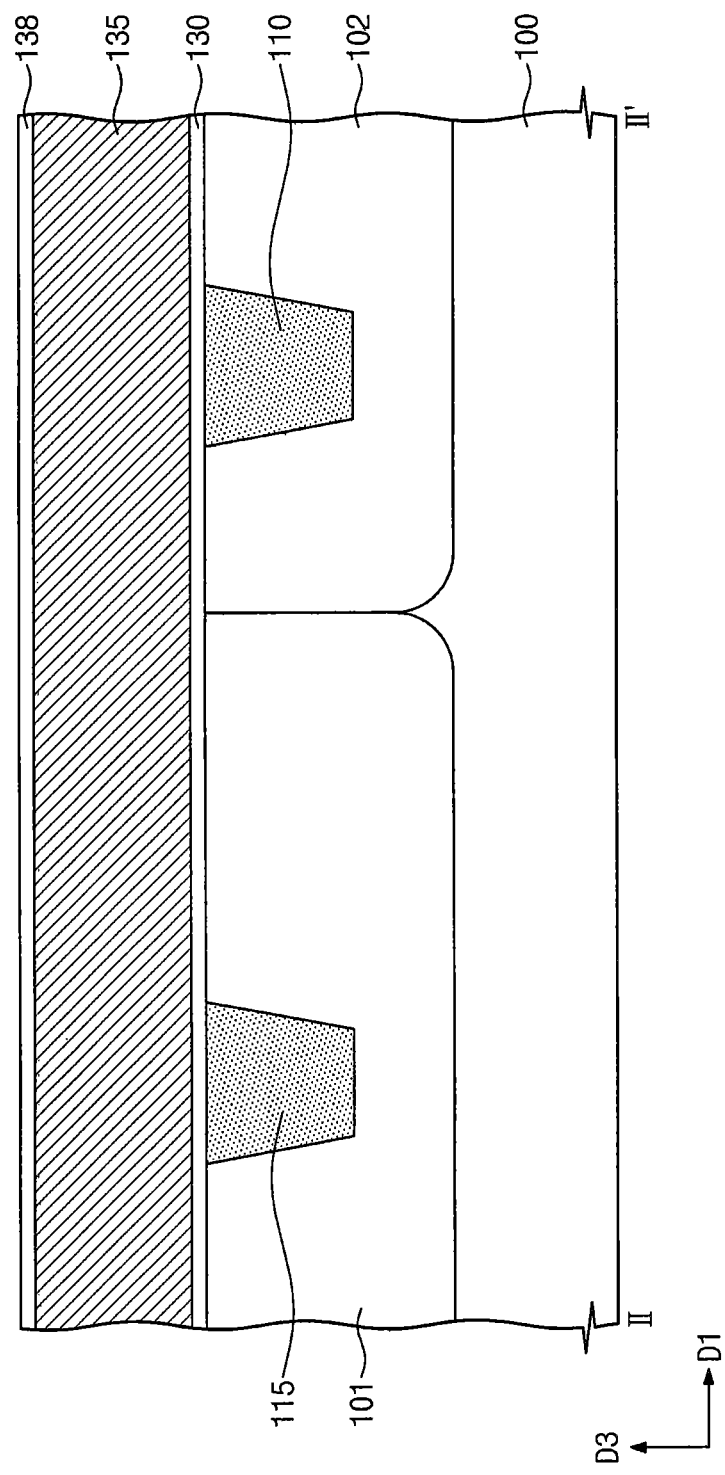
Figure 3C:
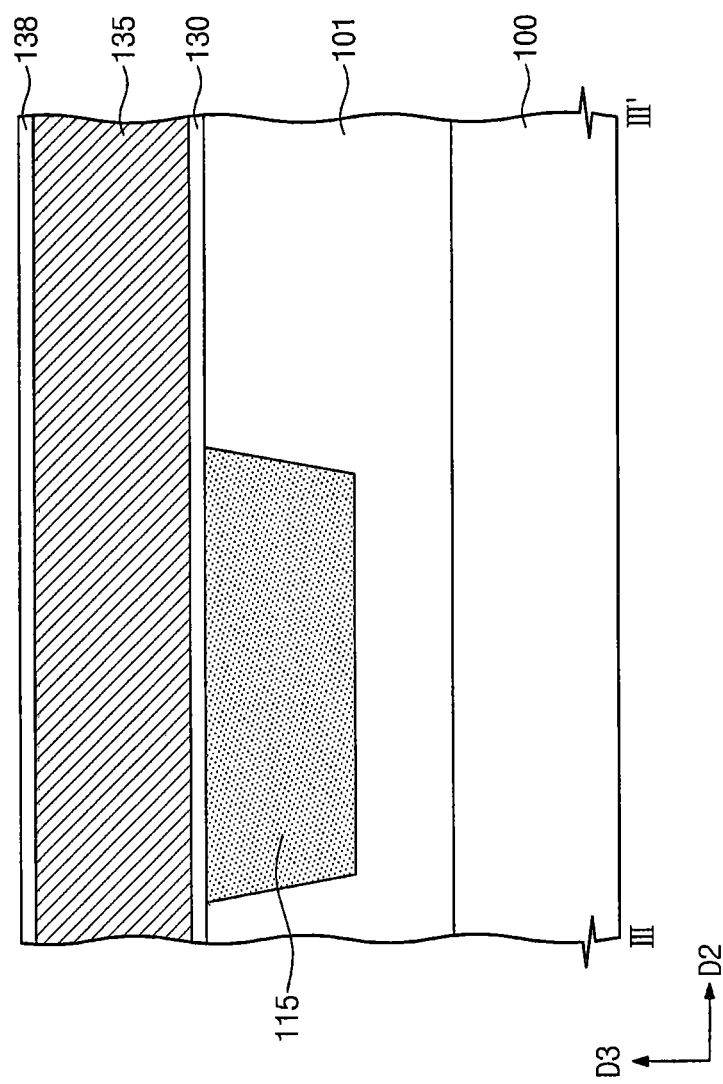
Figure 4A:
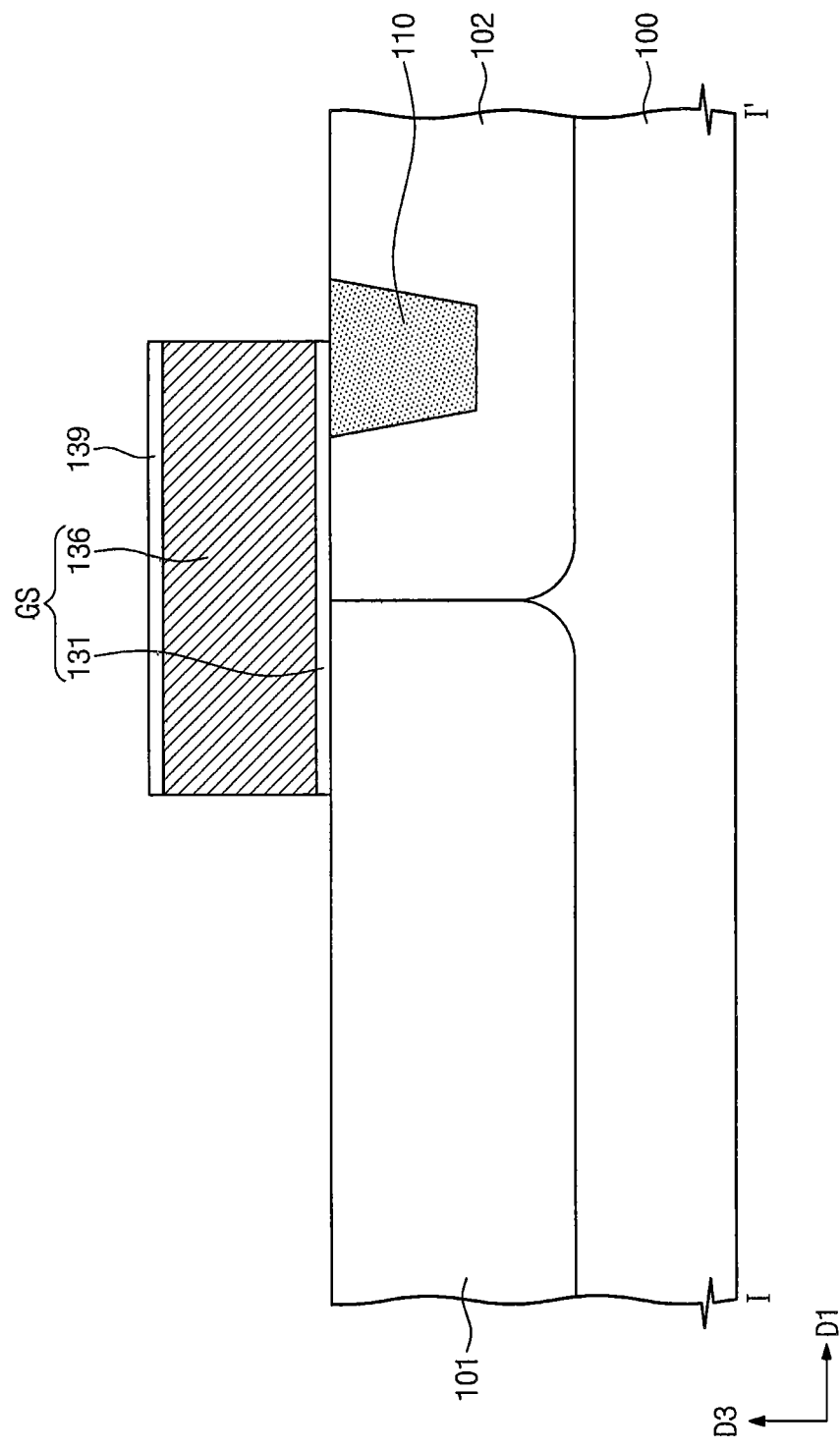
Figure 4B:
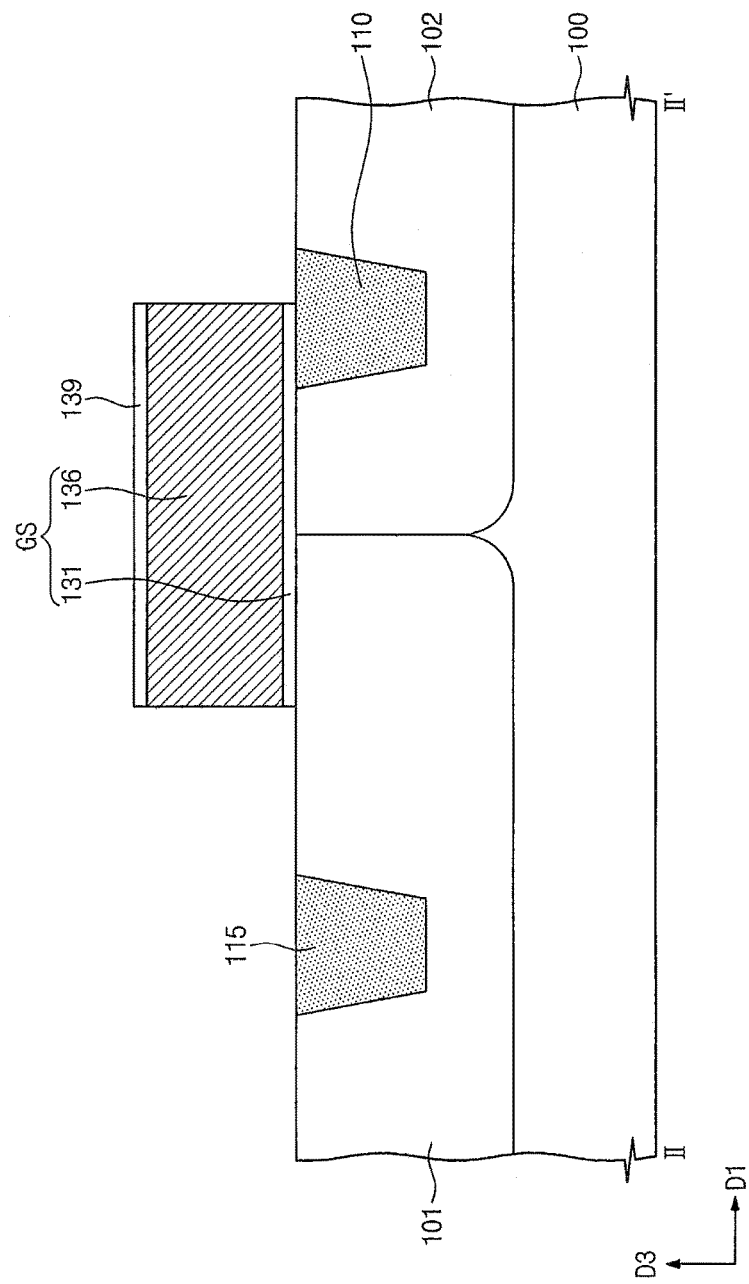
Figure 4C:
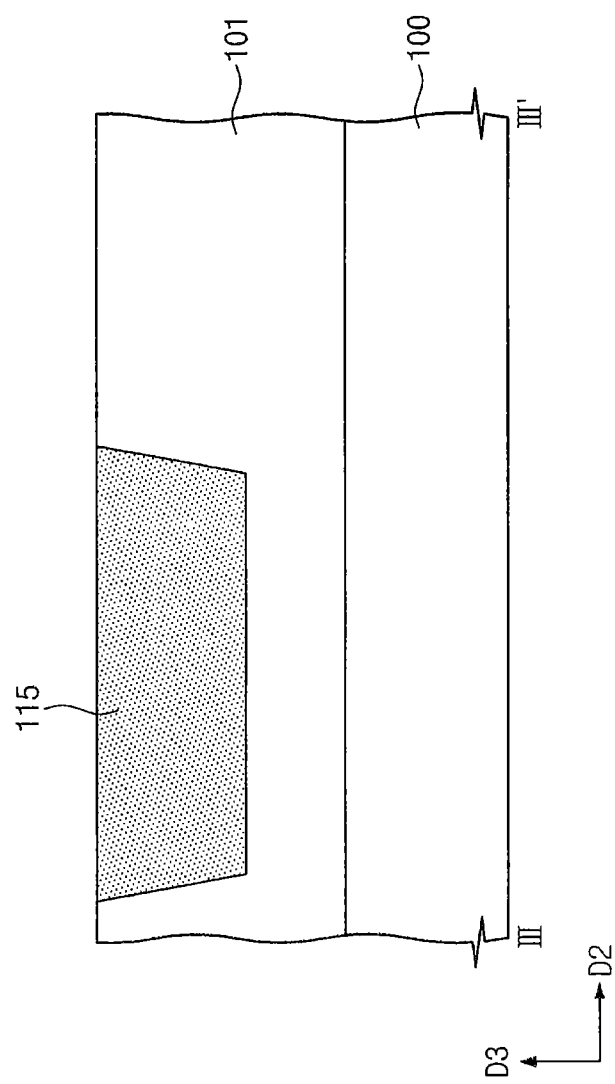
Figure 5A:
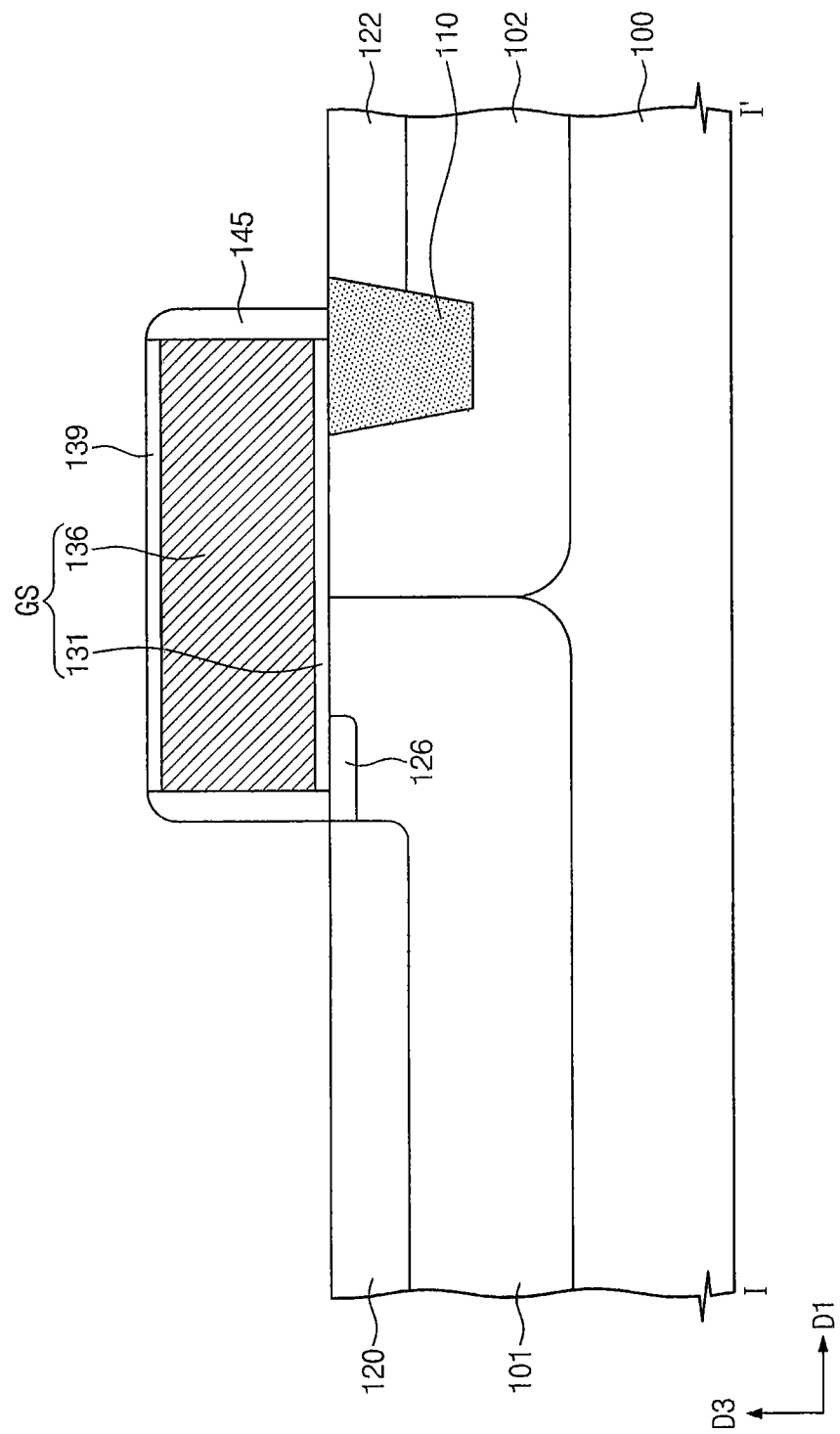
Figure 5B:
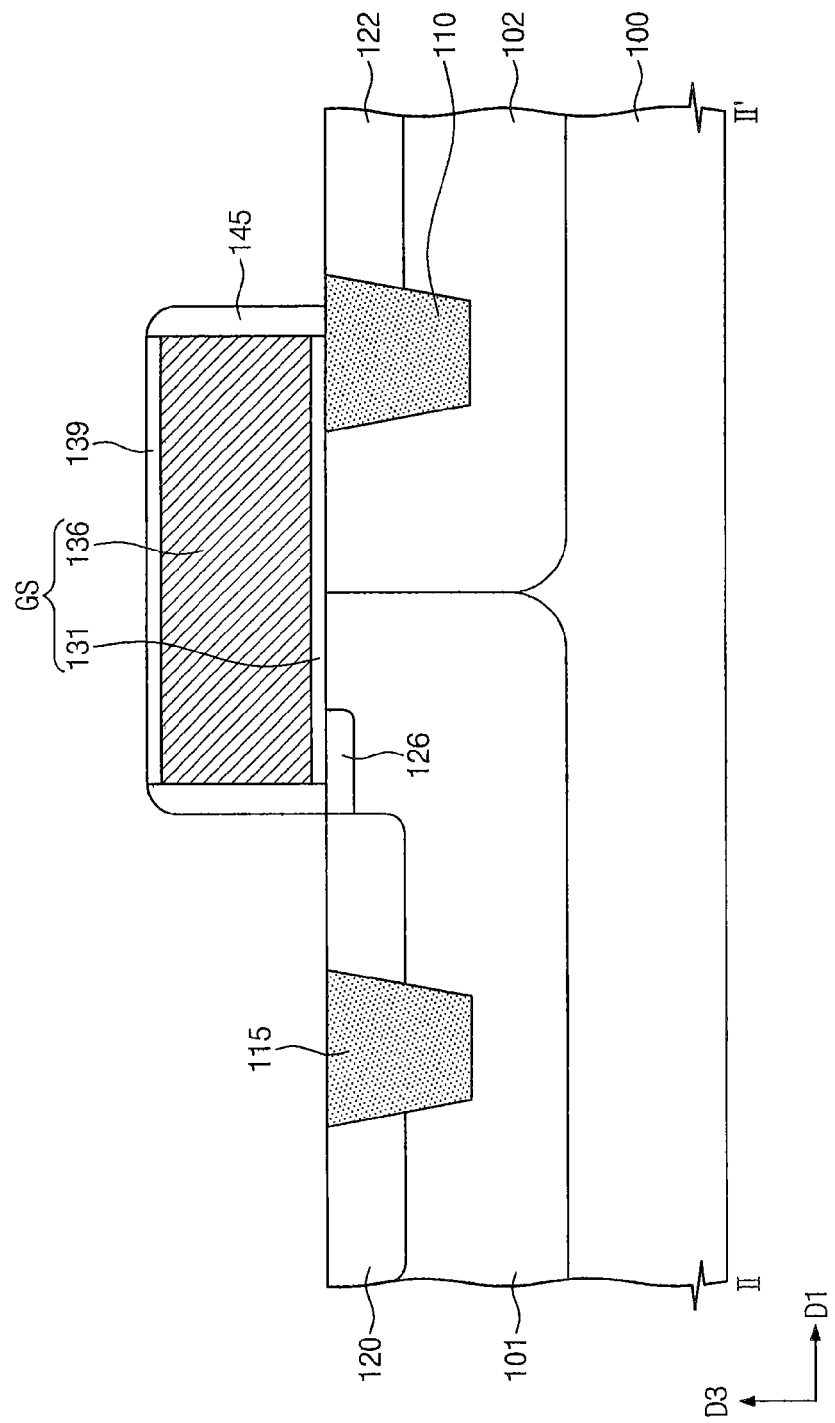
Figure 5C:
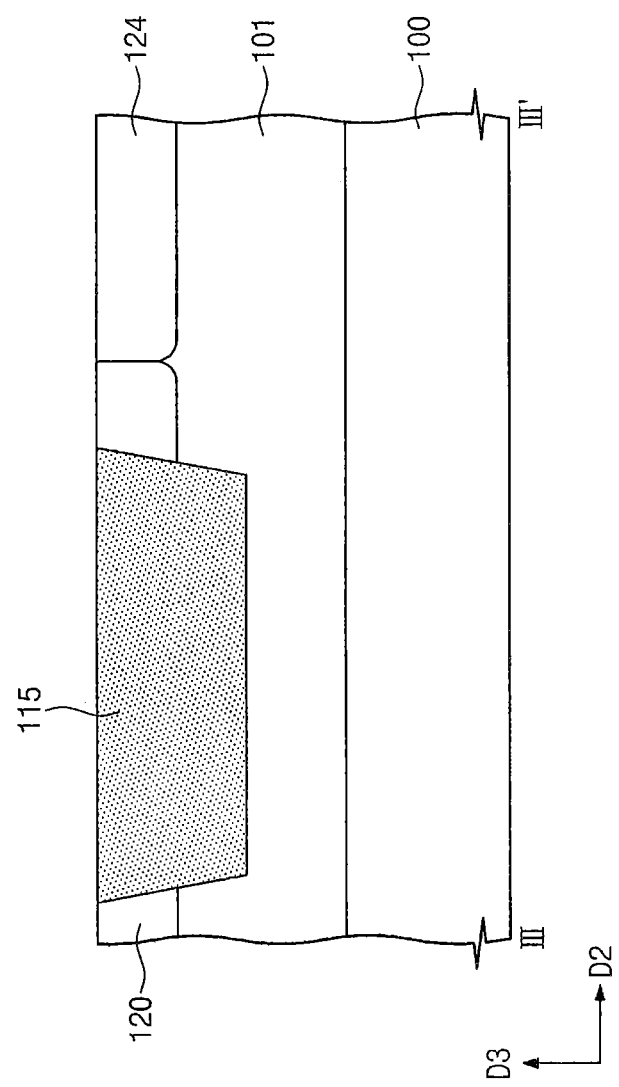
Figure 6A:
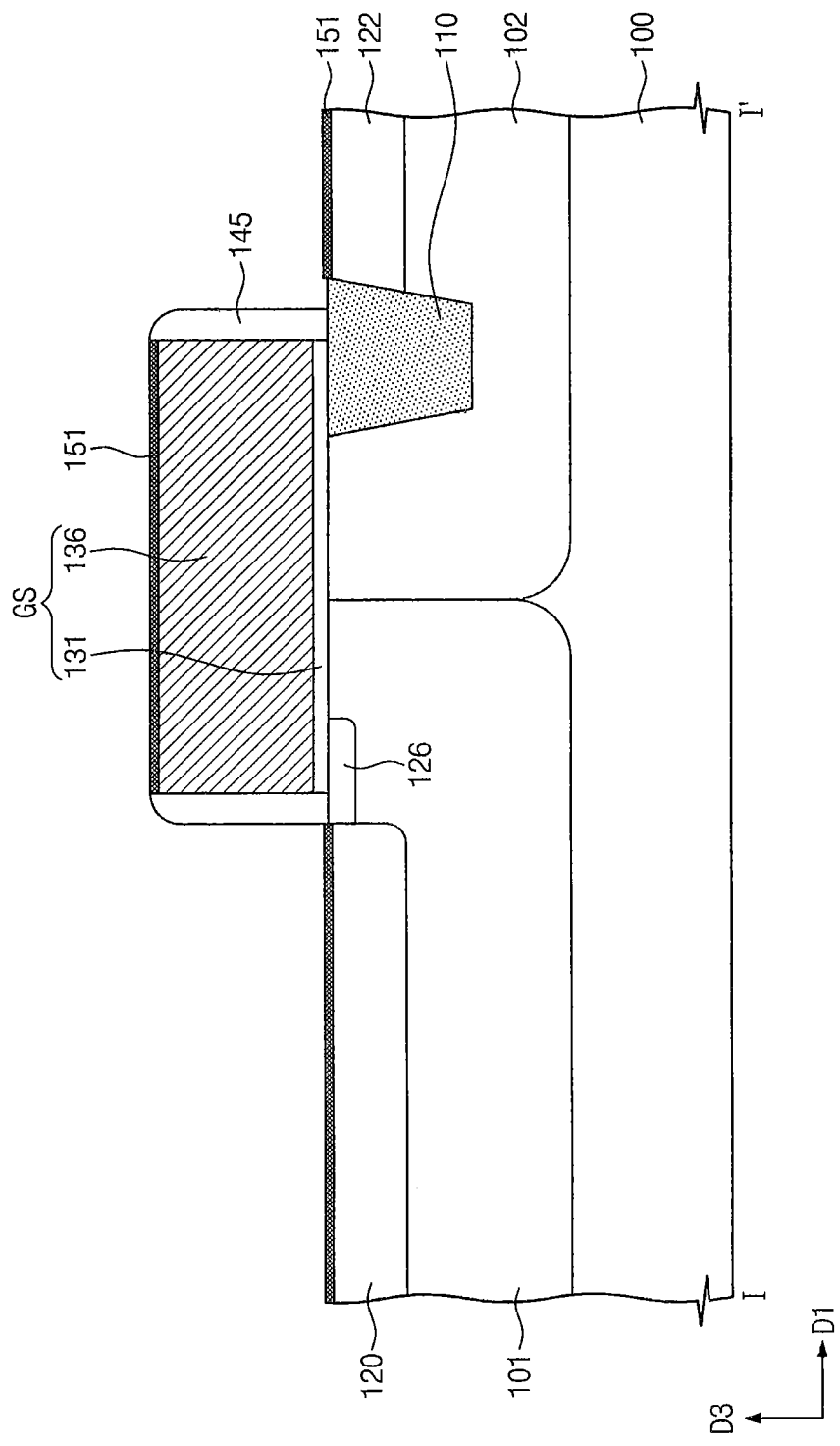
Figure 6B:
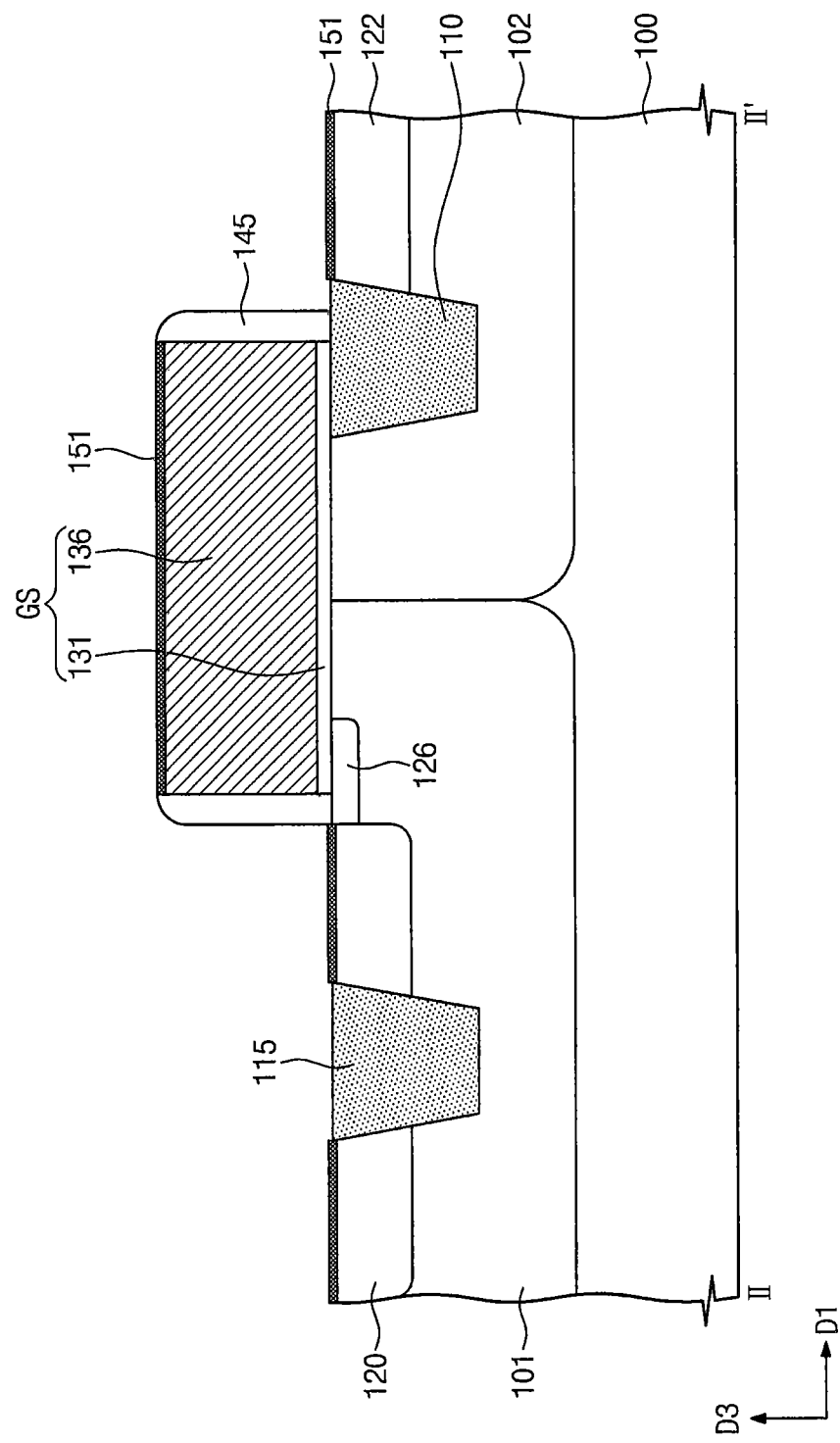
Figure 7A:
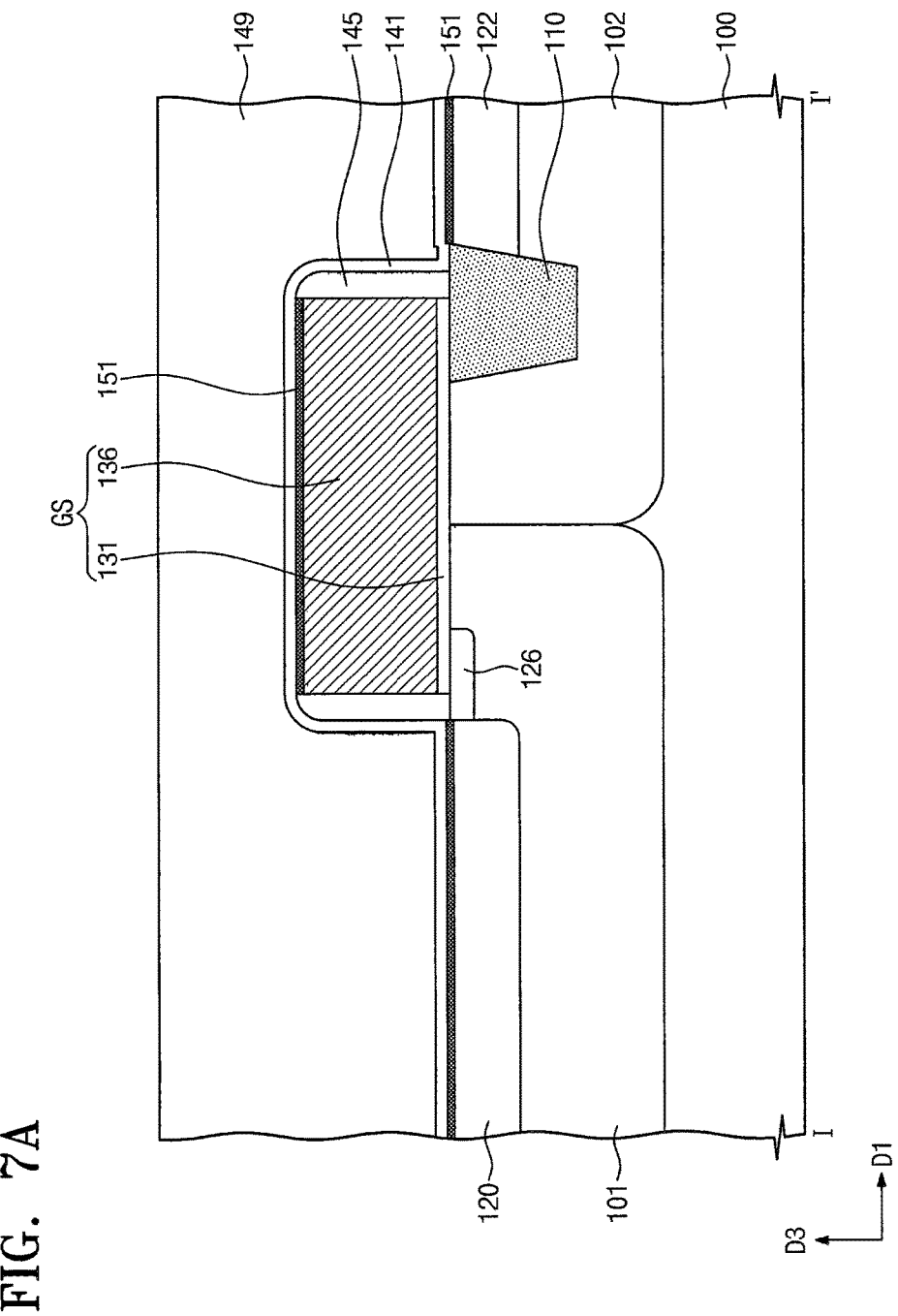
Figure 7B:
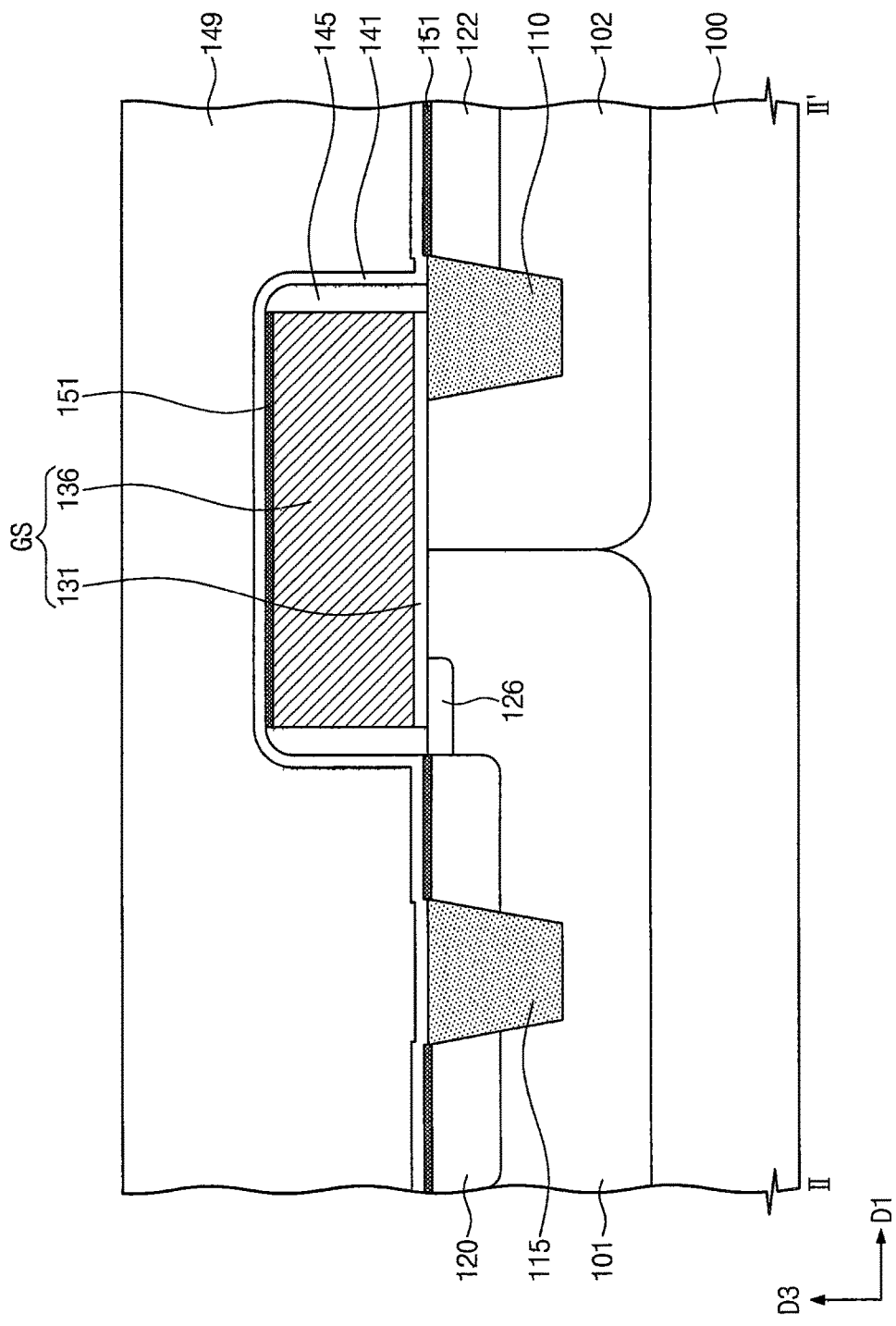
Figure 7C:
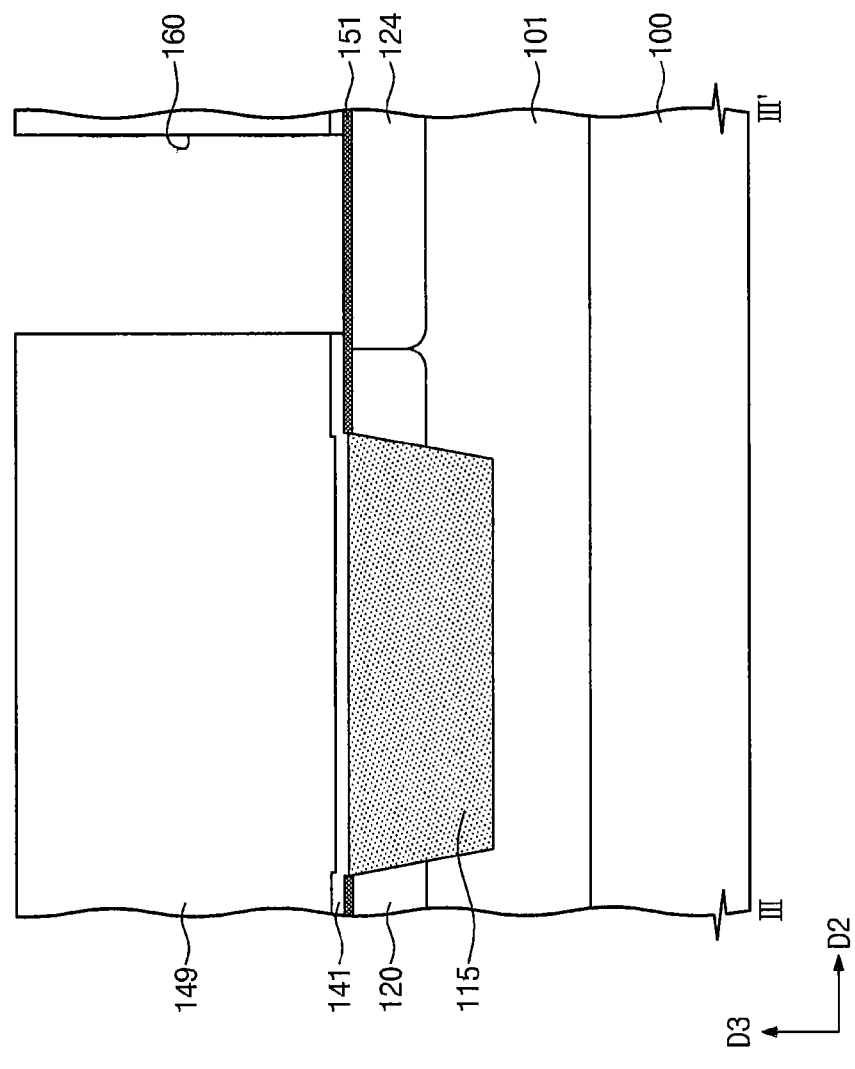

FIG. 1A is a schematic plan view of a semiconductor device according to some example embodiments of present inventive concepts. FIGS. 1B through 1D are sectional views, which illustrate vertical sections taken along lines I-I', II-II', and III-III', respectively, of FIG. 1A. In detail, FIGS. 1A through 1D may illustrate a high voltage transistor of a semiconductor device. Additionally or alternatively, the semiconductor device may include transistors different from the high voltage transistor. As an example, the high voltage transistor may be a P-Lateral double diffused MOS (P-LDMOS) transistor.

Referring to FIGS. 1A through 1D, a plurality of impurity regions 101, 102, 120, 122, 124, and 126 may be provided in a substrate 100. The substrate 100 may include a semiconductor-based structure having a portion formed of, for example, silicon. The semiconductor-based structure may include at least one of silicon, silicon-on-insulator (SOI), or a silicon epitaxial layer supported by a semiconductor structure. As an example, the substrate 100 may be a silicon substrate doped with n-type impurities.

The plurality of impurity regions may include source regions 120 and drain regions 122. The source and drain regions 120 and 122 may extend in a second direction D2 parallel to a top surface of the substrate 100. As an example, each of the source and drain regions 120 and 122 may be shaped like a line or bar, when viewed in a plan view. The source and drain regions 120 and 122 may be provided in an alternating manner along a first direction D1 crossing (e.g., intersecting) the second direction D2. The source and drain regions 120 and 122 may be highly-doped p-type regions.

The plurality of impurity regions may include first extended regions 126 extending from the source regions 120 toward the drain regions 122. The first extended regions 126 may be lightly-doped p-type regions. As an example, the first extended regions 126 may be formed in such a way that a doping concentration thereof is about 5-30% of that of the source and drain regions 120 and 122.

The plurality of impurity regions may include well regions 101. The source regions 120 may be provided in the well regions 101. However, the well regions 101 may be absent/omitted from a region adjacent to the drain regions 122. The well regions 101 may have a different conductivity type from that of the source and drain regions 120 and 122. For example, the well regions 101 may be lightly-doped n-type regions.

The plurality of impurity regions may include well contact regions 124 provided in the well regions 101, respectively. Each of the well contact regions 124 may be provided at an end portion of a corresponding one of the source regions 120. The well contact regions 124 may have the same conductivity type as that of the well regions 101. As an example, the well contact regions 124 may be highly-doped n-type regions. A voltage may be applied to the well regions 101 through the well contact regions 124. The well contact regions 124 may be in direct contact with the source regions 120, and thus, the well contact regions 124 may form p-n junctions with the source regions 120, respectively.

The plurality of impurity regions may include drift regions 102 adjacent to the drain regions 122. Each of the drift regions 102 may be provided between the well region 101 and the drain region 122. The drain regions 122 may be provided in the drift regions 102, respectively. The drift regions 102 may have the same conductivity type as that of the source and drain regions 120 and 122. The drift regions 102 may have a doping concentration lower than that of the first extended regions 126. As an example, the drift regions 102 may be lightly-doped p-type regions. The drift regions 102 may make it possible to reduce/suppress a hot carrier effect, which may occur when a high voltage is applied to the drain regions 122. In other words, the drift regions 102 may have a relatively low doping concentration, thereby decreasing an electric field between the source regions 120 and the drain regions 122. Accordingly, it may be possible to reduce/suppress the hot carrier effect, which may be caused by carriers moving from the source regions 120 to the drain regions 122. This may make it possible to improve endurance and reliability of the semiconductor device.

At least one gapfill pattern 115 may be provided in each of the source regions 120. For concise description, disposition and shape of the gapfill pattern 115 relative to one source region 120 and one well region 101 will be described below. The gapfill patterns 115 may be formed to penetrate the source region 120 when viewed in a sectional view and may be arranged along the second direction D2 when viewed in a plan view. Each of the gapfill patterns 115 may be shaped like a line or bar. In detail, when viewed in plan view, sidewalls of each of the gapfill patterns 115 may be enclosed by the source region 120. Further, each of the gapfill patterns 115 may be provided in the form of an island formed in the well region 101. Bottom surfaces of the gapfill patterns 115 may be positioned at a higher level than that of the well region 101. The bottom surfaces of the gapfill patterns 115 may be positioned at a lower level than that of the source region 120. The gapfill patterns 115 may be formed spaced apart from the drain region 122 and the drift region 102 in a horizontal direction. Further, the gapfill patterns 115 may be spaced apart from a gate electrode 136, which will be described below, and thus the gapfill patterns 115 may not be overlapped with the gate electrode 136, when viewed in a plan view.

In example embodiments, trenches may be formed on the substrate 100, and the gapfill patterns 115 may include an insulating material filling the trenches. The insulating material for the gapfill patterns 115 may be silicon oxide or silicon oxynitride. As an example, the gapfill patterns 115 may be provided in the form of a Shallow Trench Isolation (STI) or a field oxide layer. Alternatively, the gapfill patterns 115 may include a silicon germanium (SiGe) layer filling the trenches.

As in the case of power devices, for a high voltage transistor, it may be necessary to increase breakdown voltage and decrease on-resistance (Ron). However, the breakdown voltage and the on-resistance are usually proportional to each other, and thus, an increase of the breakdown voltage may lead to an undesirable increase of the on-resistance. By contrast, according to some example embodiments of present inventive concepts, the high voltage transistor may include a plurality of gapfill patterns 115, which are provided in the source region 120 to allow for an increase in breakdown voltage and a decrease in on-resistance of the high voltage transistor. For the P-Lateral double diffused MOS (P-LDMOS) transistor, electrical characteristics of the transistor may be primarily/dominantly determined by major carriers (that is, holes). Here, the gapfill patterns 115 may be configured to exert a compressive stress on a channel region between the source and drain regions 120 and 122. This may make it possible to increase mobility of the holes and reduce the on-resistance of the transistor. In particular, by providing the gapfill patterns 115, it may be possible to selectively reduce the on-resistance, without any significant change in other electrical characteristics (e.g., breakdown voltage).

Insulating isolation layers 110 may be respectively provided in the drift regions 102 or between the drain regions 122 and the well regions 101. Disposition and shape of the insulating isolation layer 110 relative to one drain region 122 and one drift region 102 will be described below. When viewed in a plan view, the insulating isolation layer 110 may extend parallel to the drain region 122 or in the second direction D2. As an example, the insulating isolation layer 110 may be a line-shaped structure. Unlike the afore-described gapfill patterns 115, the insulating isolation layer 110 may extend to have the same length as that of a corresponding one of the drain regions 122. The insulating isolation layer 110 may have a bottom surface positioned at a higher level than that of the drift region 102.

The insulating isolation layer 110 may be formed using the process for forming the gapfill patterns 115. Accordingly, the bottom surface of the insulating isolation layer 110 may be substantially coplanar with those of the gapfill patterns 115. However, a width of the insulating isolation layer 110 may be the same as or different from that of each of the gapfill patterns 115.

In example embodiments, the insulating isolation layer 110 may include an insulating material filling a corresponding one of the trenches. The insulating material for the insulating isolation layer 110 may be silicon oxide or silicon oxynitride. As an example, the insulating isolation layer 110 may be provided in the form of a STI or a field oxide layer.

The insulating isolation layer 110 may allow an electric current between the source and drain regions 120 and 122 to flow along a roundabout path in the drift region 102. Accordingly, it may be possible to more effectively reduce/suppress the hot carrier effect.

Gate structures GS may be provided on the substrate 100. Each of the gate structures GS may include a gate insulating layer 131 and a gate electrode 136. Each of the gate structures GS may be a line-shaped structure extending parallel to the second direction D2. An adjacent pair of the gate structures GS may be spaced apart from each other in the first direction D1. When viewed in plan view, the gate structures GS may be respectively provided on regions between the source and drain regions 120 and 122. Further, each of the gate structures GS may extend over the insulating isolation layer 110 to partially overlap the insulating isolation layer 110, when viewed in plan view.

The gate insulating layers 131 may include a silicon oxide layer or a high-k dielectric, whose dielectric constant is higher than that of the silicon oxide layer. As an example, the gate insulating layers 131 may include at least one of metal oxides (e.g., hafnium oxide and aluminum oxide) or metal-semiconductor-oxygen compounds (e.g., hafnium-silicon-oxygen-nitrogen compounds). Each of the gate insulating layers 131 may include a plurality of layers. As an example, each of the gate insulating layers 131 may be provided in the form of a stack including a hafnium oxide layer and an aluminum oxide layer. In the case where the gate insulating layers 131 include a high-k dielectric, it may be possible to reduce a leakage current of a high voltage transistor, to which a relatively high voltage is applied.

The gate electrodes 136 may be provided on the gate insulating layers 131, respectively. As an example, the gate electrodes 136 may include at least one of metal nitrides, metallic materials, or semiconductor materials. The metal nitrides for the gate electrodes 136 may include titanium nitride or tantalum nitride. The metallic materials for the gate electrodes 136 may include titanium, tantalum, tungsten, copper, or aluminum. The semiconductor materials for the gate electrodes 136 may include doped poly silicon. As another example, each of the gate electrodes 136 may include a plurality of layers. In detail, each of the gate electrodes 136 may be provided in the form of a stack including a metal layer and a semiconductor layer.

Spacers 145 may be provided on sidewalls of each of the gate structures GS. The spacers 145 may include at least one of a silicon oxide layer, a silicon oxynitride layer, or a silicon nitride layer. An interlayer insulating layer 149 may be provided to overlap/cover the gate structures GS. The interlayer insulating layer 149 may include at least one of a silicon oxide layer or a silicon oxynitride layer. An etch stop layer 141 may be provided between the interlayer insulating layer 149 and the substrate 100. The etch stop layer 141 may include a silicon nitride layer.

First contacts 161 may be electrically connected to the source regions 120 and the well contact regions 124 through the interlayer insulating layer 149. Second contacts 166 may be electrically connected to the drain regions 122 through the interlayer insulating layer 149. In some embodiments, the first contacts 161 may be in direct contact with the well contact regions 124. Here, the well contact regions 124 may be in direct contact with the source regions 120 and thus, the well contact regions 124 may form p-n junctions with the source regions 120, respectively. Alternatively, the well contact regions 124 and the source regions 120 may be connected in common to a metal silicide layer 151, and thus, the well contact regions 124 and the source regions 120 may be in a substantially equipotential state. The first and second contacts 161 and 166 may include at least one of metals or conductive metal nitrides.

A metal silicide layer 151 may be provided on the source and drain regions 120 and 122, the well contact regions 124, and the gate structures GS. The metal silicide layer 151 may be configured to realize an ohmic contact property between the first and second contacts 161 and 166 and underlying semiconductor layers.

Source lines SL and drain lines DL may be provided on the interlayer insulating layer 149. The source lines SL may be connected to the well contact regions 124 and the source regions 120 through the first contacts 161. The source lines SL may extend parallel to the second direction D2. The drain lines DL and the drain regions 122 may be connected to each other through the second contacts 166. The drain lines DL may extend parallel to the second direction D2. The source lines SL and the drain lines DL may be alternatingly disposed in the first direction D1. The source lines SL and the drain lines DL may include at least one of metals or conductive metal nitrides.

FIGS. 2A, 3A, 4A, 5A, 6A, and 7A; 2B, 3B, 4B, 5B, 6B, and 7B; and 2C, 3C, 4C, 5C, 6C, and 7C are sectional views illustrating a method of fabricating a semiconductor device, according to some example embodiments of present inventive concepts. In detail, FIGS. 2A, 3A, 4A, 5A, 6A, and 7A are sectional views taken along line I-I' of FIG. 1A. FIGS. 2B, 3B, 4B, 5B, 6B, and 7B are sectional views taken along line II-II' of FIG. 1A. FIGS. 2C, 3C, 4C, 5C, 6C, and 7C are sectional views taken along line III-III' of FIG. 1A.

Referring to FIGS. 1A and 2A through 2C, a substrate 100 may be provided. The substrate 100 may include a semiconductor-based structure having a portion formed of, for example, silicon. The semiconductor-based structure may include at least one of silicon, silicon-on-insulator (SOI), or a silicon epitaxial layer supported by a semiconductor structure. As an example, the substrate 100 may be a silicon substrate doped with n-type impurities.

Gapfill patterns 115 and insulating isolation layers 110 may be formed on the substrate 100. For example, first and second trenches TR1 and TR2 may be formed on the substrate 100. When viewed in plan view, the first trenches TR1 may be arranged in a second direction D2 parallel to a top surface of the substrate 100. The first trenches TR1 may be formed in consideration of positions of source regions 120 to be described below. The second trenches TR2 may extend parallel to the second direction D2. Each of the second trenches TR2 may be formed spaced apart from the first trenches TR1, which are arranged along the second direction D2, in the first direction D1. The first direction D1 may intersect the second direction D2. The second trenches TR2 may be formed in consideration of positions of drain regions 122, which will be formed in a subsequent process. The first and second trenches TR1 and TR2 may be simultaneously formed by patterning the substrate 100.

In example embodiments, the first and second trenches TR1 and TR2 may be filled with an insulating material. The insulating material may be silicon oxide or silicon oxynitride. Accordingly, gapfill patterns 115 may be formed in the first trenches TR1 and insulating isolation layers 110 may be formed in the second trenches TR2. As an example, the gapfill patterns 115 and the insulating isolation layers 110 may be formed using a process for forming a STI or field oxide structure.

In certain embodiments, the second trenches TR2 may be filled with an insulating material. By contrast, the first trenches TR1 may be filled with a silicon germanium (SiGe) layer, which is epitaxially grown from portions of the substrate 100 exposed by the first trenches TR1.

Well regions 101 may be formed in the substrate 100. The well regions 101 may be lightly-doped n-type regions. Drift regions 102 may be formed to be adjacent to the well regions 101, respectively. The drift regions 102 may be lightly-doped p-type regions. The well regions 101 and the drift regions 102 may be formed by photolithography processes, which are performed using the same reticle but using different (e.g., positive and negative) types of photoresist films.

Referring to FIGS. 1A and 3A through 3C, an insulating layer 130, a conductive layer 135, and a capping layer 138 may be sequentially formed on the substrate 100. The insulating layer 130 may include a silicon oxide layer or a high-k dielectric having a higher dielectric constant than that of the silicon oxide layer. As an example, the insulating layer 130 may include at least one of metal oxides (e.g., hafnium oxide and aluminum oxide) or metal-semiconductor-oxygen compounds (e.g., hafnium-silicon-oxygen-nitrogen compounds). The insulating layer 130 may include a plurality of layers. For example, the insulating layer 130 may be provided in the form of a stack including a hafnium oxide layer and an aluminum oxide layer.

The conductive layer 135 may include at least one of metal nitrides, metallic materials, or semiconductor materials. The metal nitrides may include titanium nitride or tantalum nitride. The metallic materials may include titanium, tantalum, tungsten, copper, or aluminum. The semiconductor materials may include doped poly silicon. As another example, the conductive layer 135 may include a plurality of layers. In detail, the conductive layer 135 may be provided in the form of a stack including a metal layer and a semiconductor layer.

The capping layer 138 may be provided on the conductive layer 135. For example, the capping layer 138 may include a silicon nitride layer.

Referring to FIGS. 1A and 4A through 4C, a patterning process may be performed on the structure provided with the capping layer 138 to form gate structures GS and capping patterns 139. Each of the gate structures GS may include a gate insulating layer 131 and a gate electrode 136. The patterning process may be performed in such a way that, when viewed in a plan view, each of the gate structures GS overlaps a portion of the insulating isolation layer 110. As an example, the gate structures GS may be patterned to overlap both of the well regions 101 and the drift regions 102, when viewed in plan view.

Referring to FIGS. 1A and 5A through 5C, source regions 120, drain regions 122, and first extended regions 126 may be formed in the substrate 100. The first extended regions 126 may be doped with impurities of a low concentration and may have a p-type, and spacers 145 may be formed after the formation of the first extended regions 126. After the formation of the spacers 145, the source and drain regions 120 and 122 may be doped with impurities of a high concentration and may have the p-type.

In certain embodiments, well contact regions 124 may be formed in the well regions 101. As an example, each of the well contact regions 124 may be formed at an end portion of a corresponding one of the source regions 120. The well contact regions 124 may be doped with impurities of a high concentration and may have an n-type. In the case where, as in the well contact regions 124, doped regions are formed to have a different conductivity type from the source and drain regions 120 and 122, a mask covering a portion of the substrate 100 may be formed to impede/prevent unintended regions from being doped.

Referring to FIGS. 1A and 6A through 6C, the capping patterns 139 may be removed. The removal of the capping patterns 139 may be performed using a selective etching process. After the removal of the capping patterns 139, a metal silicide layer 151 may be formed on exposed portions of the gate electrodes 136. Here, the metal silicide layer 151 may also be formed on the source and drain regions 120 and 122 and the well contact regions 124. As an example, the formation of the metal silicide layer 151 may include forming a metal layer to cover the substrate 100 and the gate electrodes 136 and then performing a thermal treatment process on the structure with the metal layer.

Referring to FIGS. 1A and 7A through 7C, an interlayer insulating layer 149 may be formed on the structure provided with the metal silicide layer 151. The interlayer insulating layer 149 may include silicon oxide or silicon oxynitride. The interlayer insulating layer 149 may be formed to have first contact holes 160 exposing the metal silicide layer 151 and second contact holes.

An etch stop layer 141 may be formed before the formation of the interlayer insulating layer 149. As an example, the etch stop layer 141 may be a silicon nitride layer. The etch stop layer 141 may protect/prevent the metal silicide layer 151 from being damaged when the first contact holes 160 and the second contact holes are formed.

Referring back to FIGS. 1A through 1D, first contacts 161 may be formed in the first contact holes 160. The first contacts 161 may be electrically connected to the source regions 120 and the well contact regions 124. Second contacts 166 may be formed in the second contact holes. The second contacts 166 may be electrically connected to the drain regions 122. Source lines SL may be formed on and electrically connected to the first contacts 161. Drain lines DL may be formed on and electrically connected to the second contacts 166. The first and second contacts 161 and 166 and the source and drain lines SL and DL may be formed of, for example, at least one of metals or conductive metal nitrides.

The afore-described method of fabricating a semiconductor device may be applied with some modifications to methods for fabricating a semiconductor device, according to some example embodiments of present inventive concepts.

[Some Example Embodiments:P-MOS]

Figure 8A:
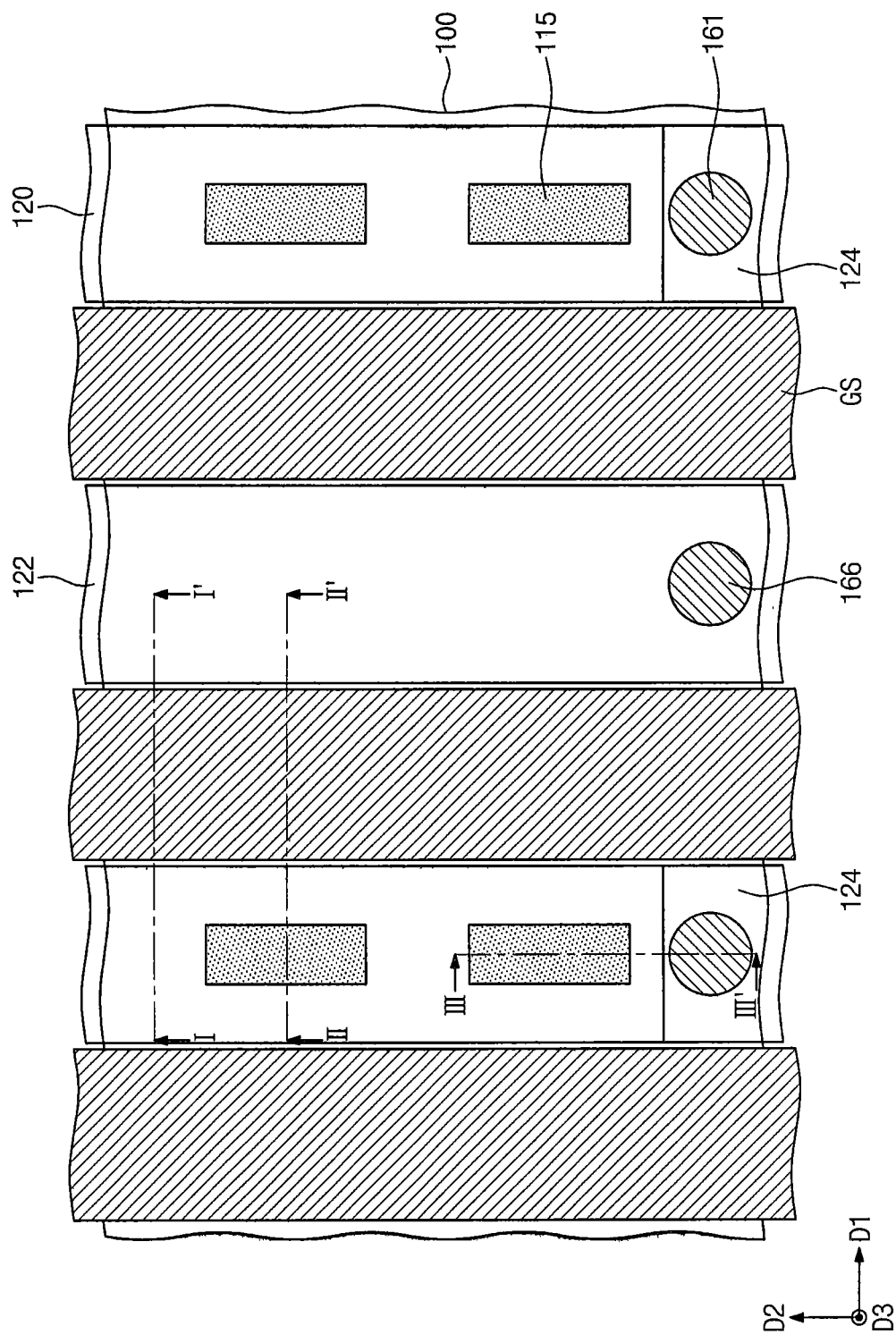
FIG. 8A is a schematic plan view of a semiconductor device according to some example embodiments of present inventive concepts.
Figure 8B:
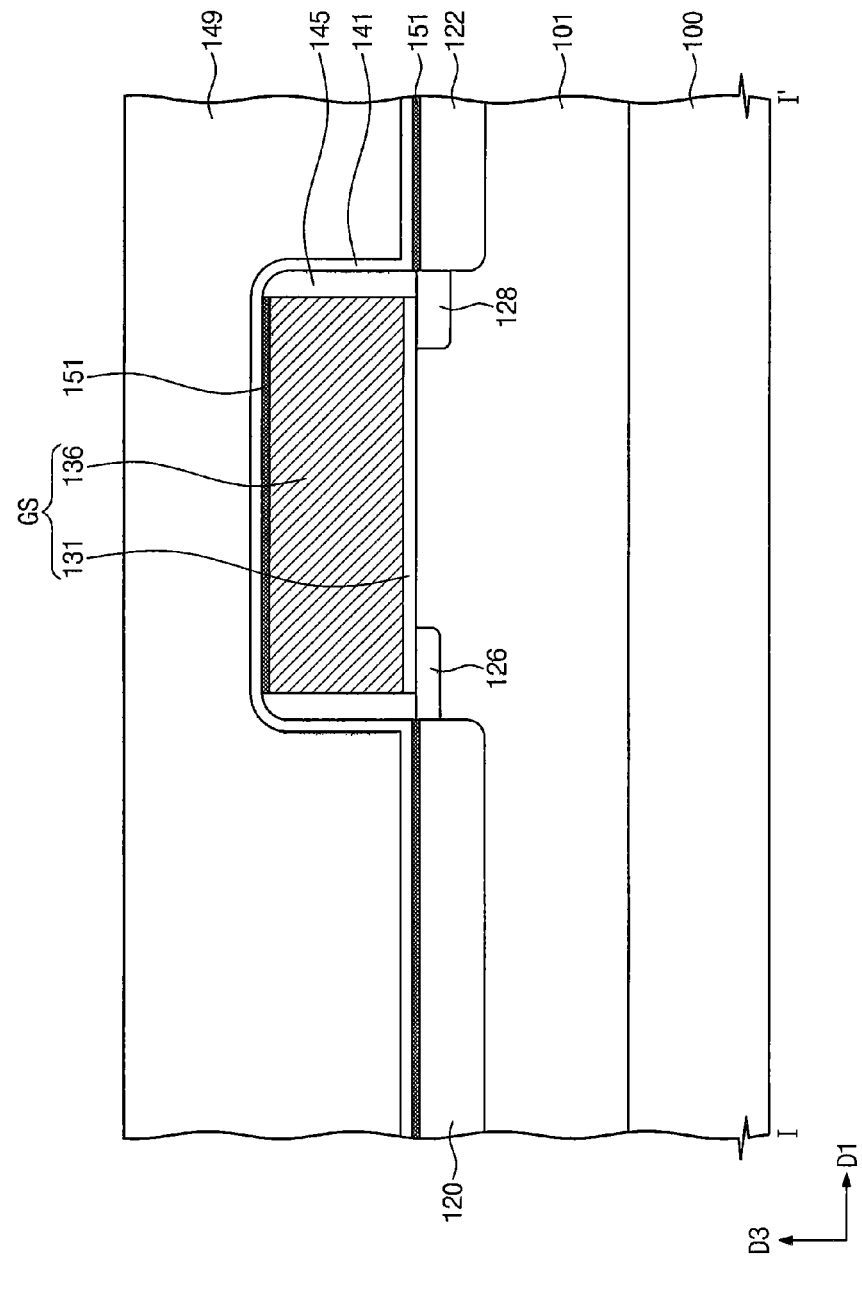
FIGS. 8B through 8D are sectional views, which illustrate vertical sections taken along lines I-I', II-II', and III-III', respectively, of FIG. 8A.
Figure 8C:
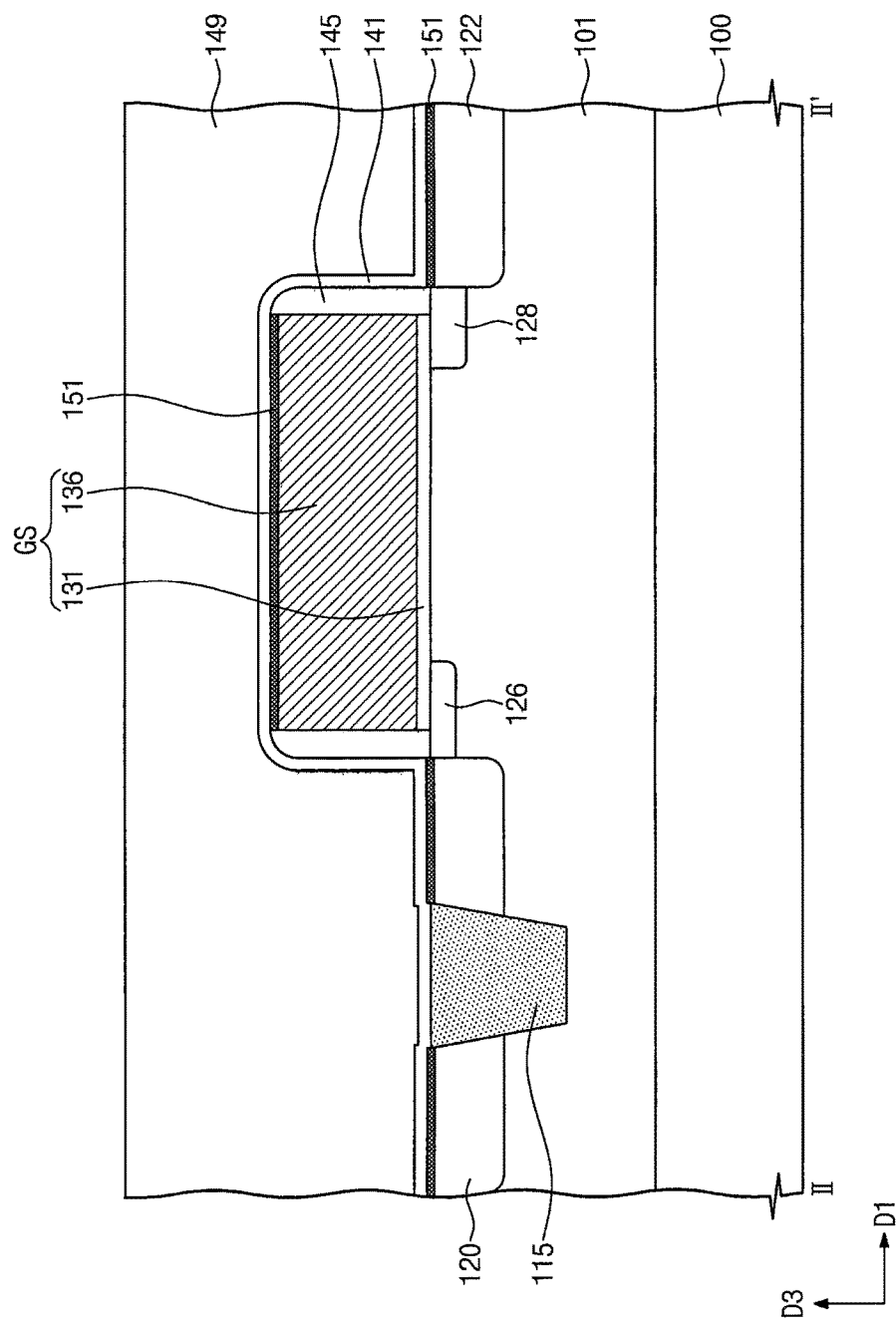
Figure 8D:
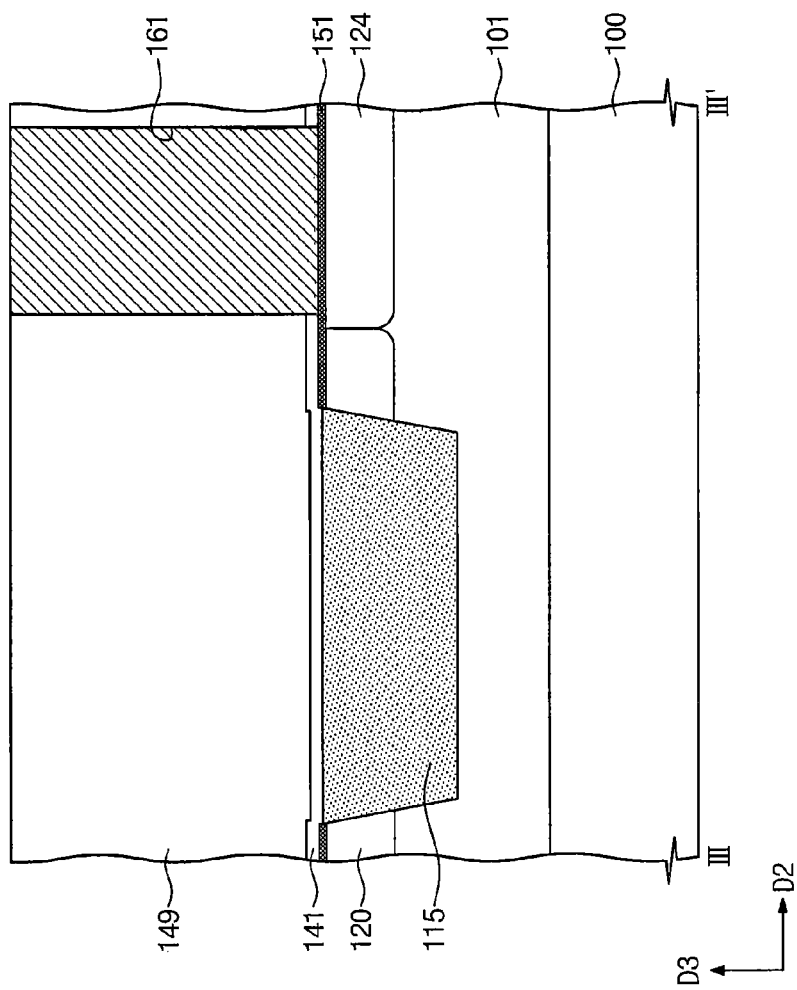

FIG. 8A is a schematic plan view of a semiconductor device according to some example embodiments of present inventive concepts. FIGS. 8B through 8D are sectional views, which illustrate vertical sections taken along lines I-I', II-II', and III-III', respectively, of FIG. 8A. In detail, FIGS. 8A through 8D may illustrate a high voltage transistor of a semiconductor device. In addition to the high voltage transistor, the semiconductor device may further include transistors different from the high voltage transistor. As an example, the high voltage transistor may be a P-MOS transistor. In the following description, an element previously described with reference to FIGS. 1A through 1D may be identified by a similar or identical reference number without repeating an overlapping description thereof, for the sake of brevity.

Referring to FIGS. 8A through 8D, source regions 120 and drain regions 122 may be provided in a substrate 100. First extended regions 126 may be provided to have a shape extending from the source regions 120 toward the drain regions 122. Also, second extended regions 128 may be provided to have a shape extending from the drain regions 122 toward the source regions 120. The second extended regions 128 may be lightly-doped p-type regions.

Well regions 101 may be provided in the substrate 100. The source regions 120 and the drain regions 122 may be provided in the well regions 101. Unlike that described with reference to FIGS. 1A through 1D, the drift regions 102 may be omitted. The well regions 101 may have a different conductivity type from that of the source and drain regions 120 and 122. For example, the well regions 101 may be lightly-doped n-type regions.

Well contact regions 124 may be provided in the well regions 101, respectively. Each of the well contact regions 124 may be provided in an end portion of a corresponding one of the source regions 120. As an example, the well contact regions 124 may be highly-doped n-type regions. The well contact regions 124 may be in direct contact with the source regions 120, and thus, the well contact regions 124 may form p-n junctions with the source regions 120, respectively.

Gapfill patterns 115 may be provided in each of the source regions 120. The gapfill patterns 115 may be provided through the source regions 120 and may be arranged along the second direction D2. The gapfill patterns 115 may be shaped like a line or bar. Other features of the gapfill patterns 115 may be substantially the same as those described with reference to FIGS. 1A through 1D.

In the case of a P-MOS transistor, electrical characteristics of the transistor may be primarily/dominantly determined by major carriers (that is, holes). Here, the gapfill patterns 115 may be configured to exert a compressive stress on a channel region between the source and drain regions 120 and 122. This may make it possible to increase mobility of the holes and reduce the on-resistance of the transistor. In particular, by providing the gapfill patterns 115, it may be possible to selectively reduce the on-resistance of the transistor, without any significant change in other electrical characteristics (e.g., breakdown voltage).

Gate structures GS may be provided on the substrate 100. Each of the gate structures GS may include a gate insulating layer 131 and a gate electrode 136. The gate insulating layers 131 may include a high-k dielectric having a dielectric constant higher than silicon oxide. The gate electrodes 136 may include at least one of metal nitrides, metallic materials, or semiconductor materials. Spacers 145 may be provided on sidewalls of each of the gate structures GS.

First contacts 161 may be electrically connected to the source regions 120 and the well contact regions 124 through the interlayer insulating layer 149. Second contacts 166 may be electrically connected to the drain regions 122 through the interlayer insulating layer 149. The first and second contacts 161 and 166 may include at least one of metals or conductive metal nitrides. A metal silicide layer 151 may be provided on the source and drain regions 120 and 122, the well contact regions 124, and the gate structures GS.

Source lines SL and drain lines DL may be provided on the interlayer insulating layer 149. The source lines SL may be connected to the well contact regions 124 and the source regions 120 through the first contacts 161. The source lines SL may extend parallel to the second direction D2. The drain lines DL may be connected to the drain regions 122 through the second contacts 166. The drain lines DL may extend parallel to the second direction D2.

[Some Example Embodiments:P-LDMOS]

Figure 9A:
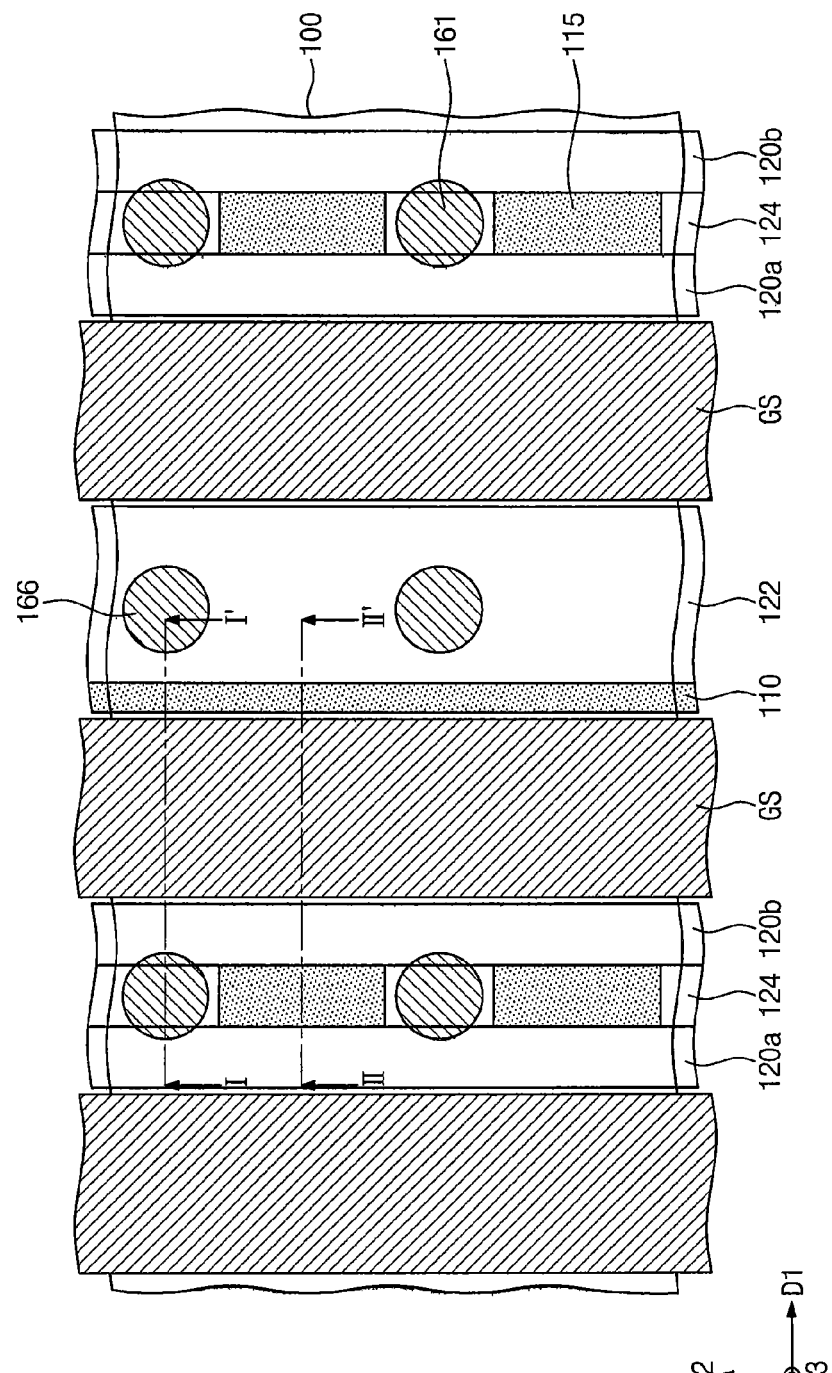
FIG. 9A is a schematic plan view of a semiconductor device according to some example embodiments of present inventive concepts.
Figure 9B:
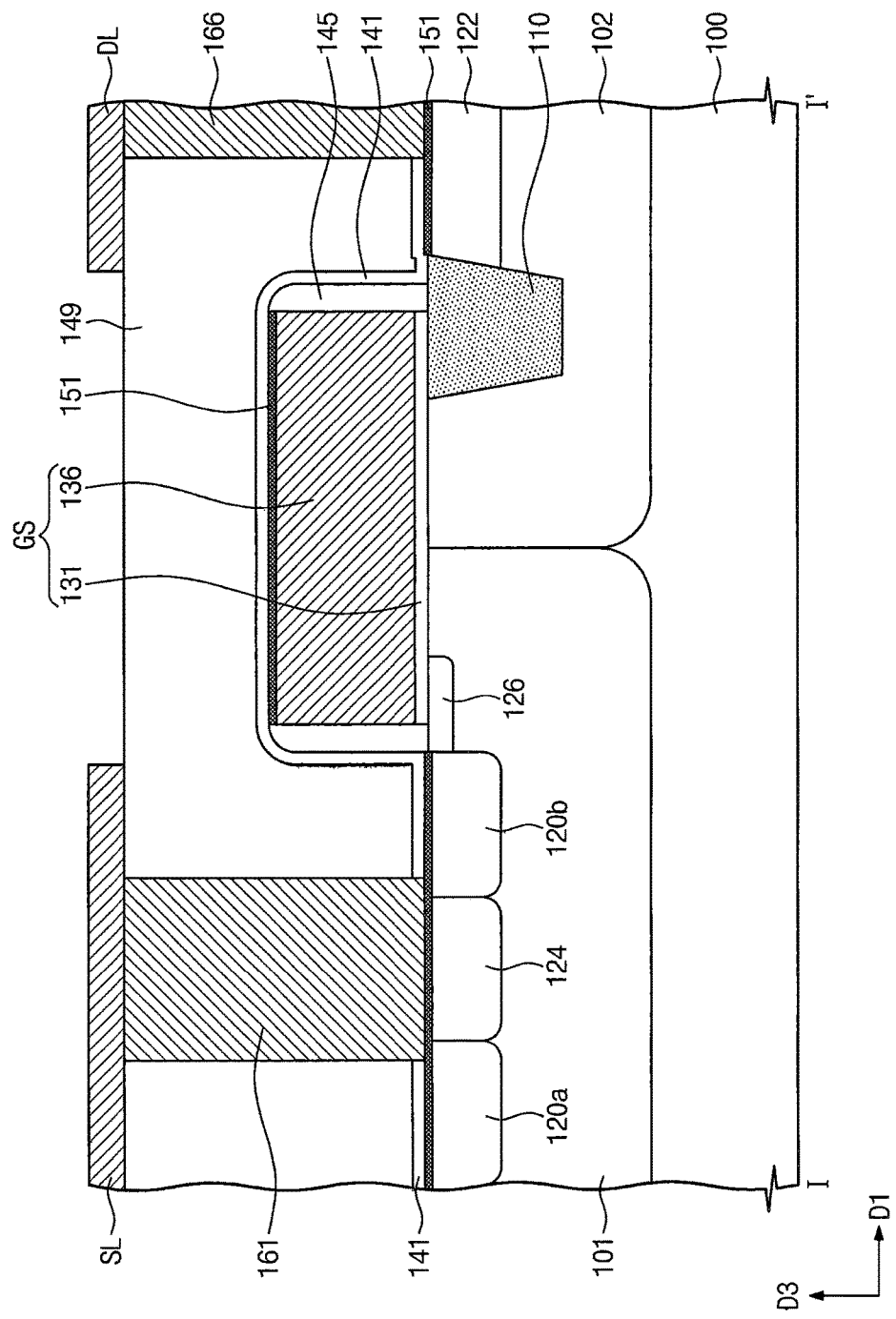
FIGS. 9B and 9C are sectional views, which illustrate vertical sections taken along lines I-I' and II-II', respectively, of FIG. 9A.
Figure 9C:
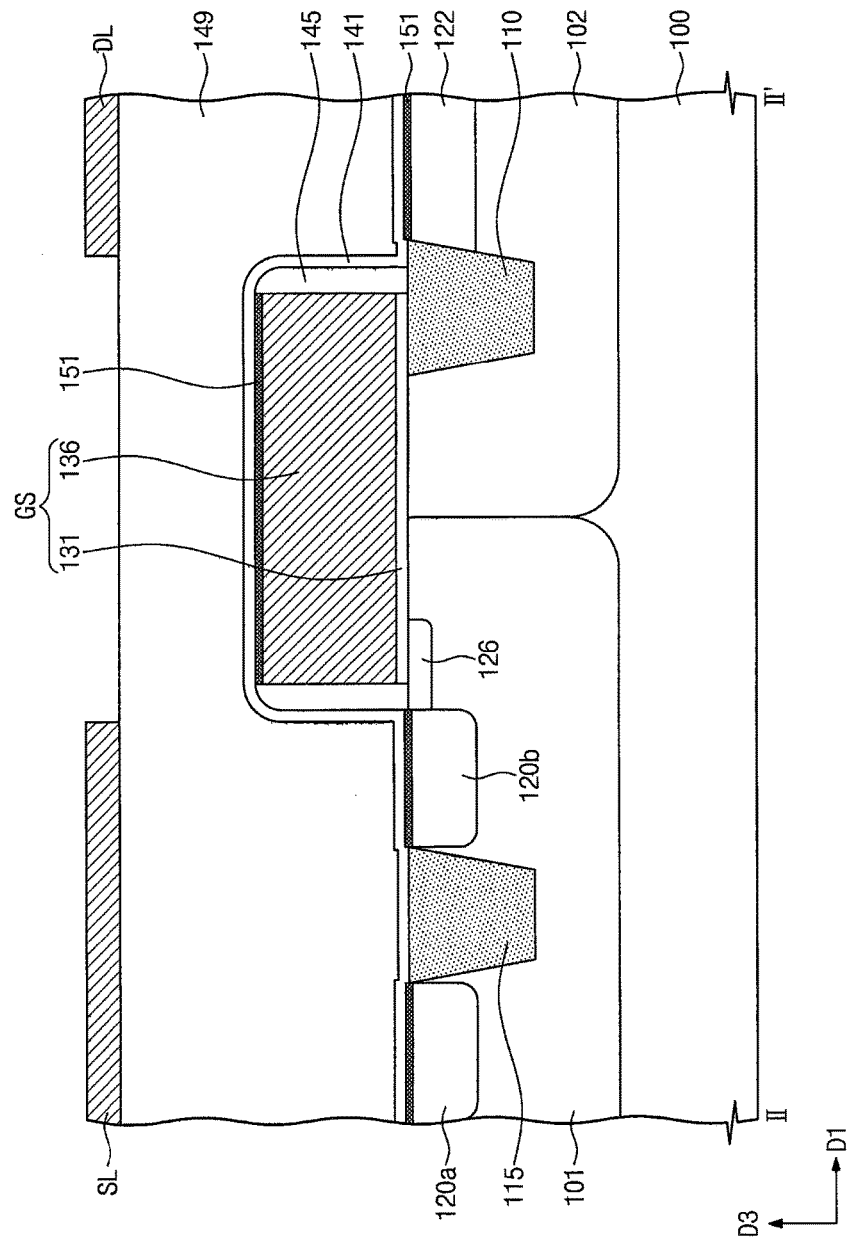

FIG. 9A is a schematic plan view of a semiconductor device according to some example embodiments of present inventive concepts. FIGS. 9B and 9C are sectional views, which illustrate vertical sections taken along lines I-I' and II-II', respectively, of FIG. 9A. In detail, FIGS. 9A through 9C may illustrate a high voltage transistor of a semiconductor device. Additionally or alternatively, the semiconductor device may include transistors different from the high voltage transistor. As an example, the high voltage transistor may be a P-Lateral double diffused MOS (P-LDMOS) transistor. In the following description, an element previously described with reference to FIGS. 1A through 1D may be identified by a similar or identical reference number without repeating an overlapping description thereof, for the sake of brevity.

Referring to FIGS. 9A through 9C, each of source regions may include a first source region 120a and a second source region 120b. Each of the first and second source regions 120a and 120b may be a line-shaped structure extending along a second direction D2 parallel to a top surface of a substrate 100. An adjacent pair of the first and second source regions 120a and 120b may be spaced apart from each other in a first direction D1 crossing (e.g., intersecting) the second direction D2.

Well contact regions 124 and gapfill patterns 115 may be interposed between the first and second source regions 120a and 120b. The well contact regions 124 and the gapfill patterns 115 may be alternatingly disposed between a pair of the first source region 120a and the second source region 120b, along the second direction D2. In other words, an adjacent pair of the well contact regions 124 may be spaced apart from each other in the second direction D2, with the gapfill pattern 115 interposed therebetween. When viewed in plan view, a width (in the first direction D1) of each of the gapfill patterns 115 may be substantially the same as that of each of the well contact regions 124.

First contacts 161 may be provided through the interlayer insulating layer 149 and may be electrically connected to the first and second source regions 120a and 120b and the well contact regions 124. The first contacts 161 may overlap the well contact regions 124, when viewed in a plan view. In other words, the first contacts 161 may be disposed along the second direction D2. Second contacts 166 may be provided through the interlayer insulating layer 149 and may be electrically connected to drain regions 122. The second contacts 166 may also be disposed along the second direction D2.

Other features of the semiconductor device according to FIGS. 9A-9C may be substantially the same as that described with reference to FIGS. 1A through 1D.

Figure 10A:
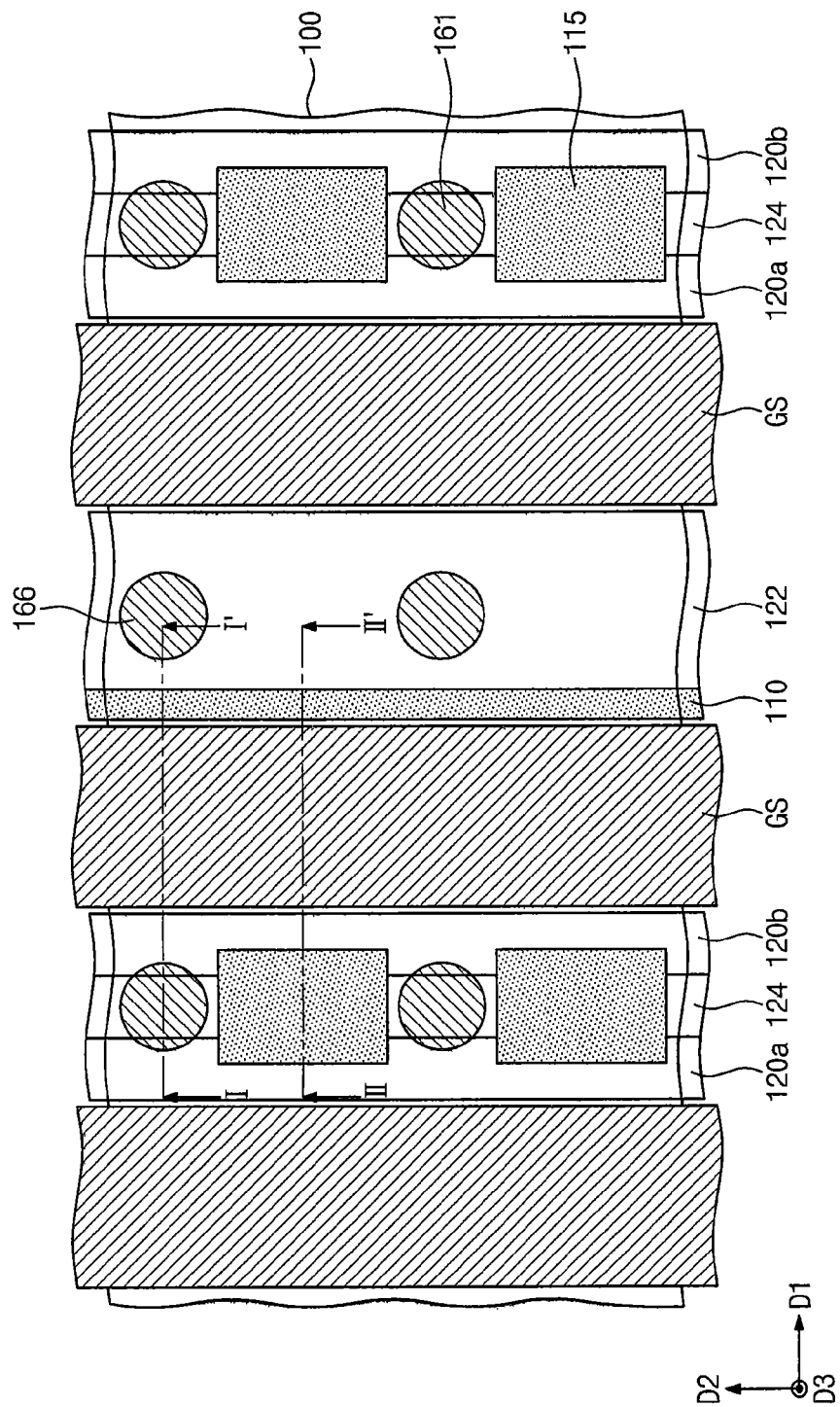
FIG. 10A is a schematic plan view of a semiconductor device according to some example embodiments of present inventive concepts.
Figure 10B:
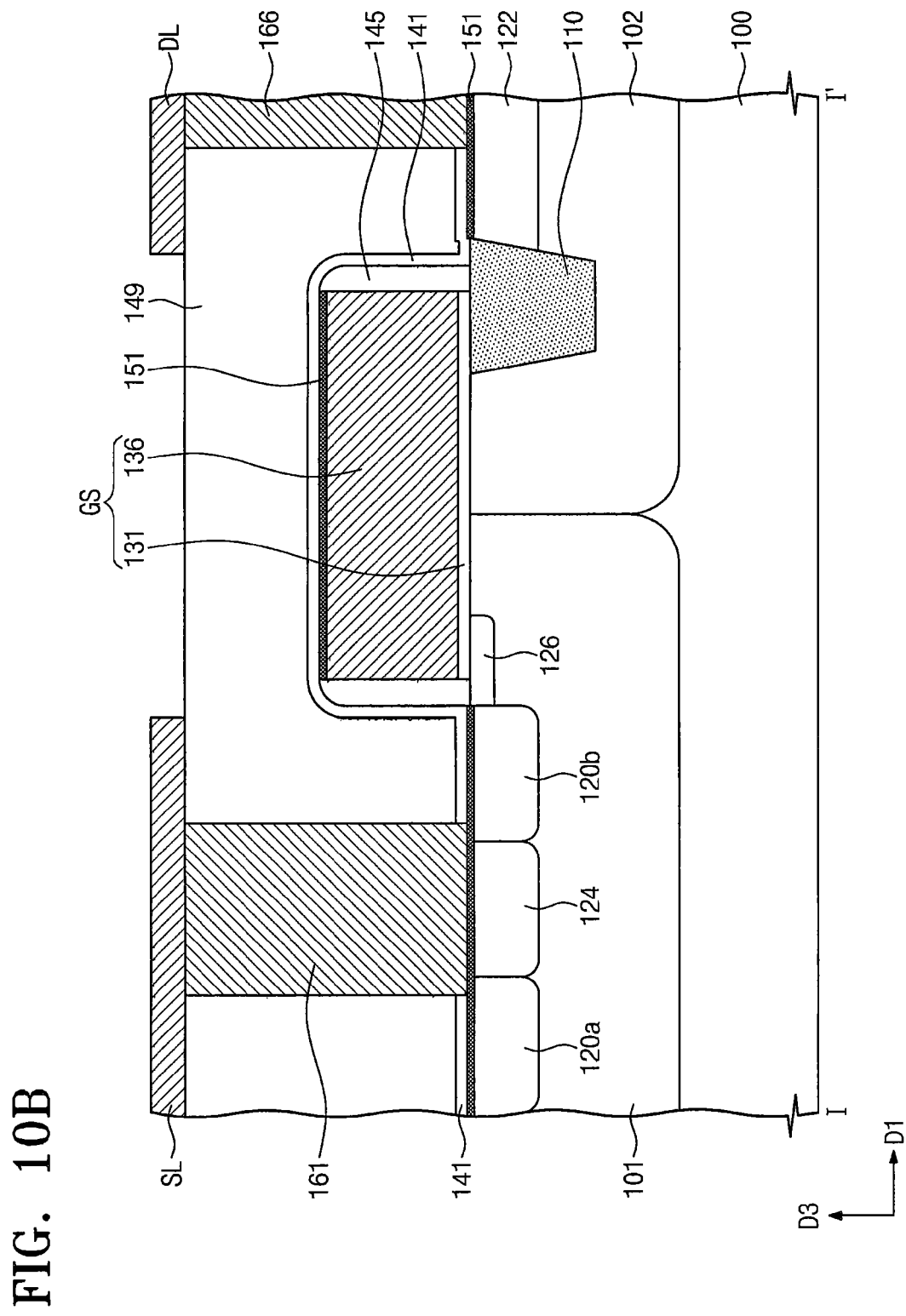
FIGS. 10B and 10C are sectional views, which illustrate vertical sections taken along lines I-I' and II-II', respectively, of FIG. 10A.
Figure 10C:
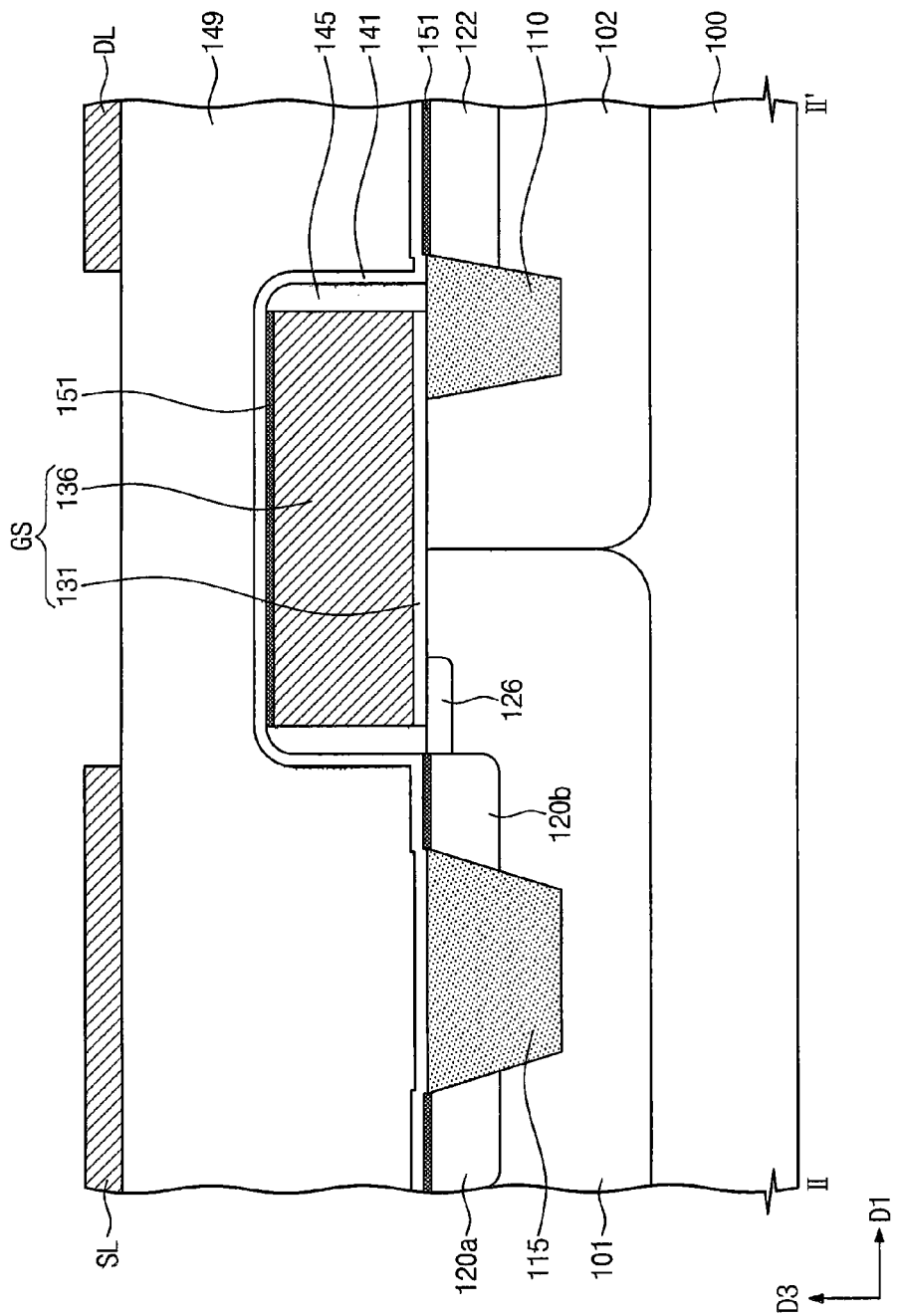

FIG. 10A is a schematic plan view of a semiconductor device according to some example embodiments of present inventive concepts. FIGS. 10B and 10C are sectional views, which illustrate vertical sections taken along lines I-I' and II-II', respectively, of FIG. 10A. In detail, FIGS. 10A through 10C may illustrate a high voltage transistor of a semiconductor device. Additionally or alternatively, the semiconductor device may include transistors different from the high voltage transistor. As an example, the high voltage transistor may be a P-Lateral double diffused MOS (P-LDMOS) transistor. In the following description, an element previously described with reference to FIGS. 9A through 9C may be identified by a similar or identical reference number without repeating an overlapping description thereof, for the sake of brevity.

Referring to FIGS. 10A through 10C, when viewed in plan view, a width (in the first direction D1) of each of the gapfill patterns 115 may be wider/greater than that of each of the well contact regions 124. In other words, each of the gapfill patterns 115 may include a portion partially overlapping the first source region 120a or the second source region 120b. Other features of the semiconductor device according to FIGS. 10A-10C may be substantially the same as that described with reference to FIGS. 9A through 9C.

Figure 11A:
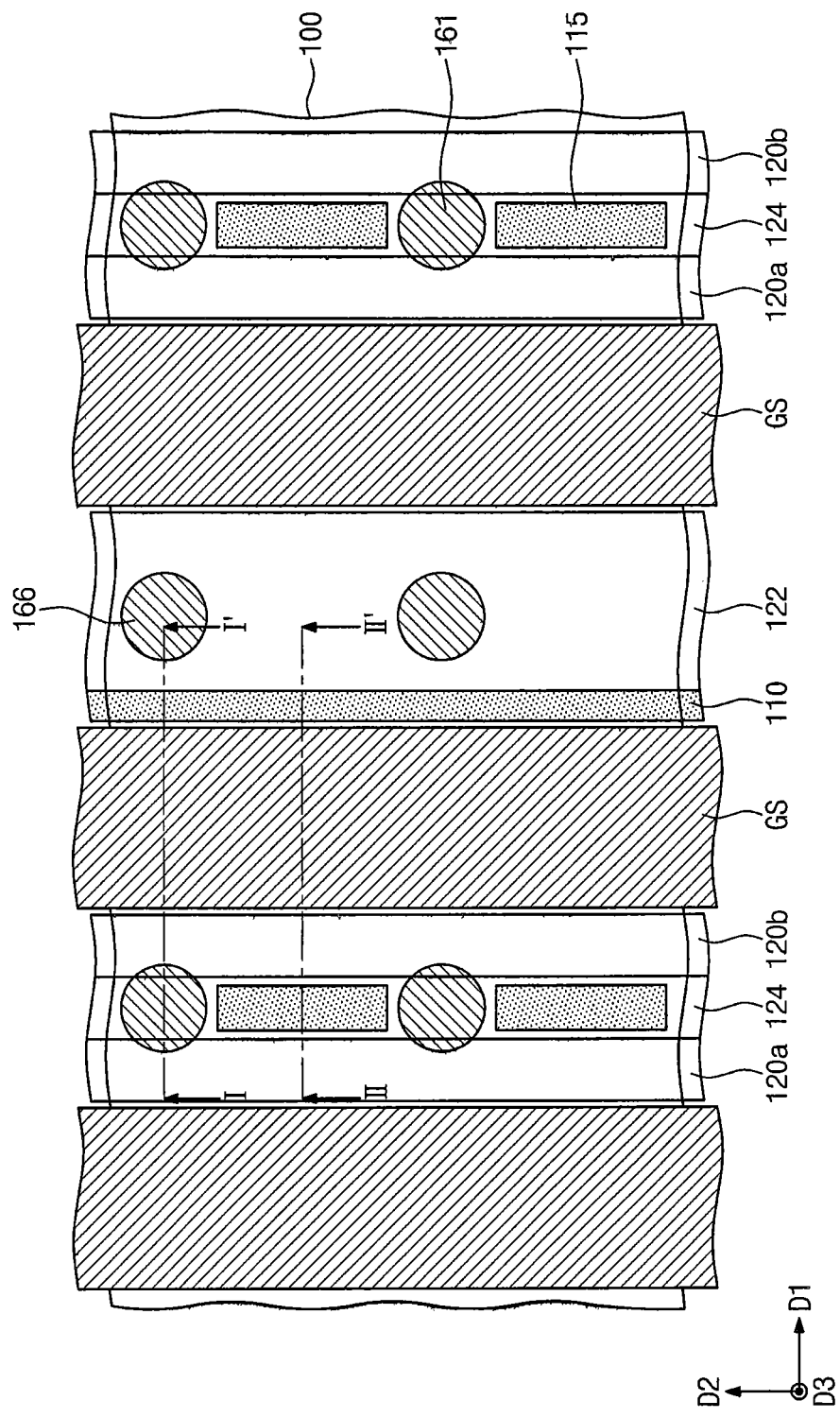
FIG. 11A is a schematic plan view of a semiconductor device according to some example embodiments of present inventive concepts.
Figure 11B:
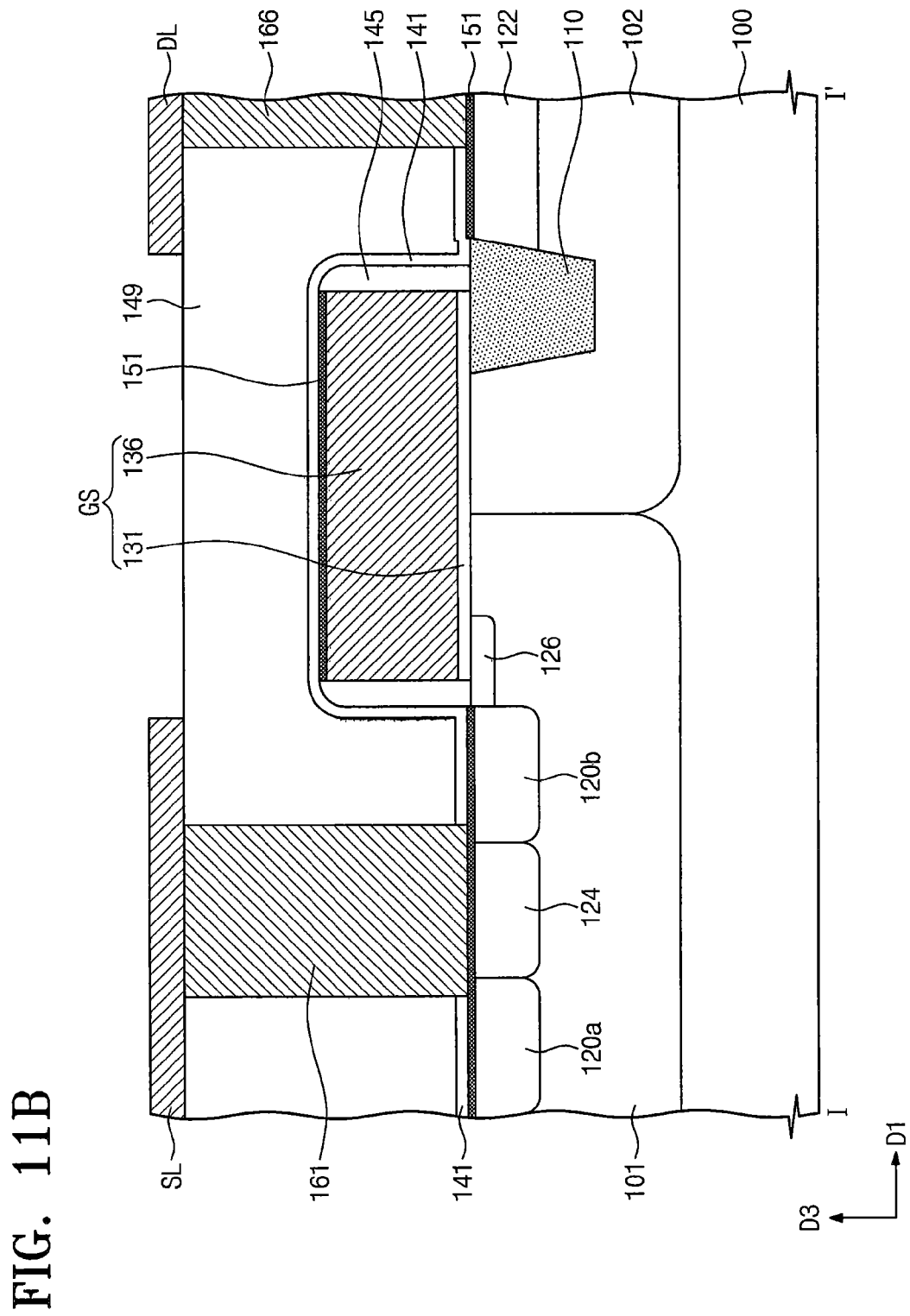
FIGS. 11B and 11C are sectional views, which illustrate vertical sections taken along lines I-I' and II-II', respectively, of FIG. 11A.
Figure 11C:
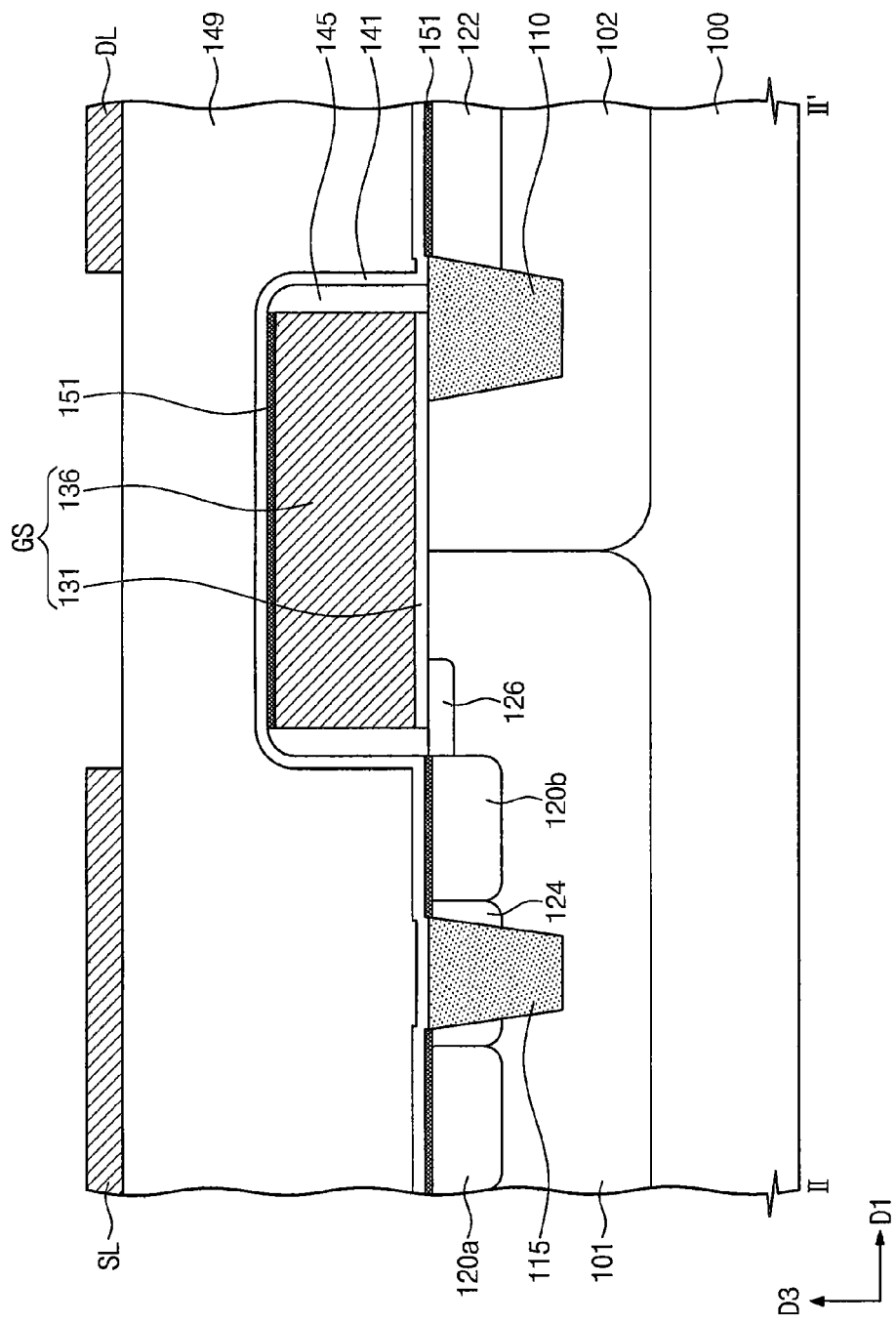

FIG. 11A is a schematic plan view of a semiconductor device according to some example embodiments of present inventive concepts. FIGS. 11B and 11C are sectional views, which illustrate vertical sections taken along lines I-I' and II-II', respectively, of FIG. 11A. In detail, FIGS. 11A through 11C may illustrate a high voltage transistor of a semiconductor device. Additionally or alternatively, the semiconductor device may include transistors different from the high voltage transistor. As an example, the high voltage transistor may be a P-Lateral double diffused MOS (P-LDMOS) transistor. In the following description, an element previously described with reference to FIGS. 9A through 9C may be identified by a similar or identical reference number without repeating an overlapping description thereof, for the sake of brevity.

Referring to FIGS. 11A through 11C, one well contact region 124 may be interposed between an adjacent pair of the first source region 120a and the second source region 120b. The well contact region 124 may extend along a second direction D2 parallel to a top surface of a substrate 100. Gapfill patterns 115 may be arranged along the well contact region 124 and/or parallel to the second direction D2. When viewed in plan view, a width (in the first direction D1) of each of the gapfill patterns 115 may be smaller than that of each of the well contact regions 124. In other words, the gapfill patterns 115 may be enclosed by the well contact region 124. Other features of the semiconductor device according to FIGS. 11A-11C may be substantially the same as that described with reference to FIGS. 9A through 9C.

[Some Example Embodiments:P-MOS]

Figure 12A:
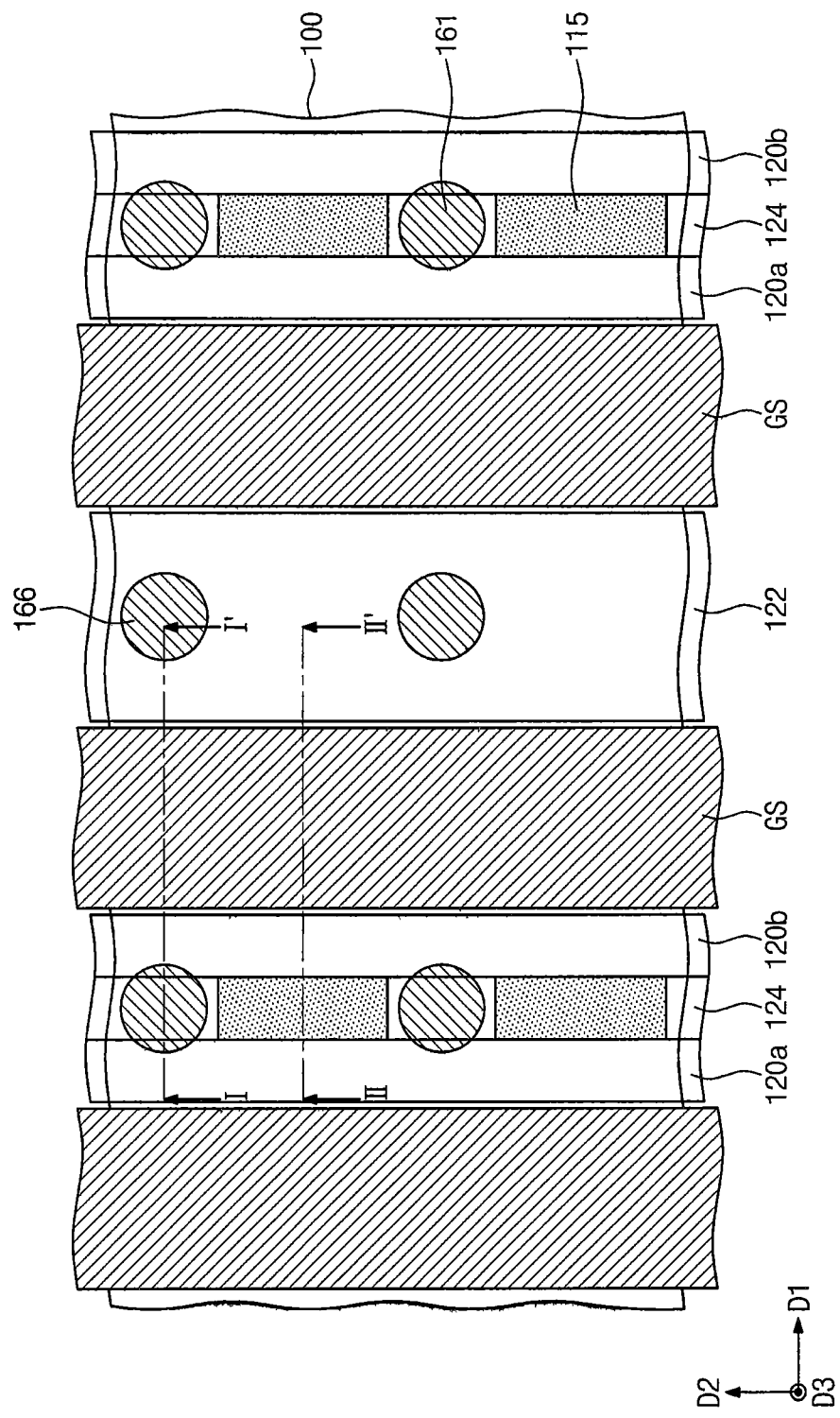
FIG. 12A is a schematic plan view of a semiconductor device according to some example embodiments of present inventive concepts.
Figure 12B:
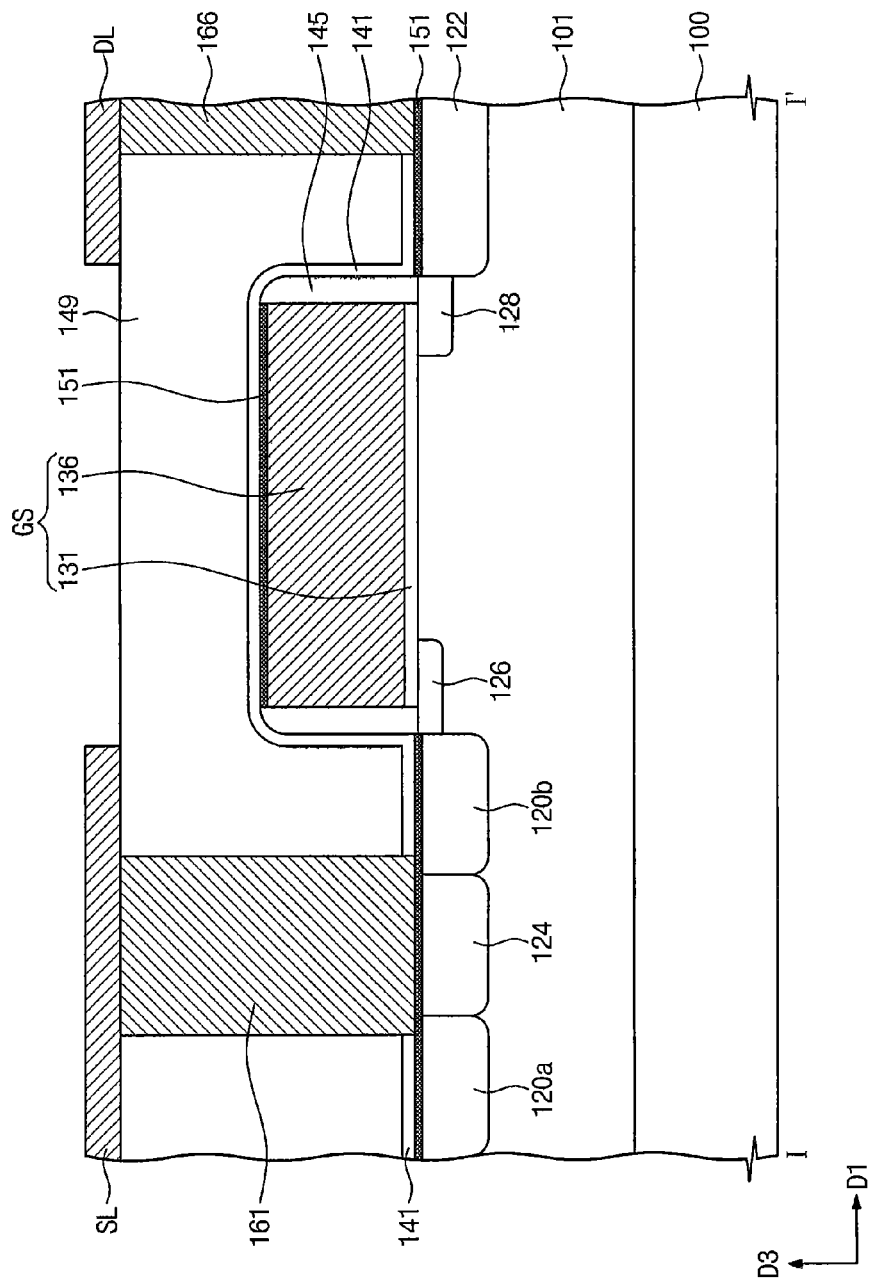
FIGS. 12B and 12C are sectional views, which illustrate vertical sections taken along lines I-I' and II-II', respectively, of FIG. 12A.
Figure 12C:
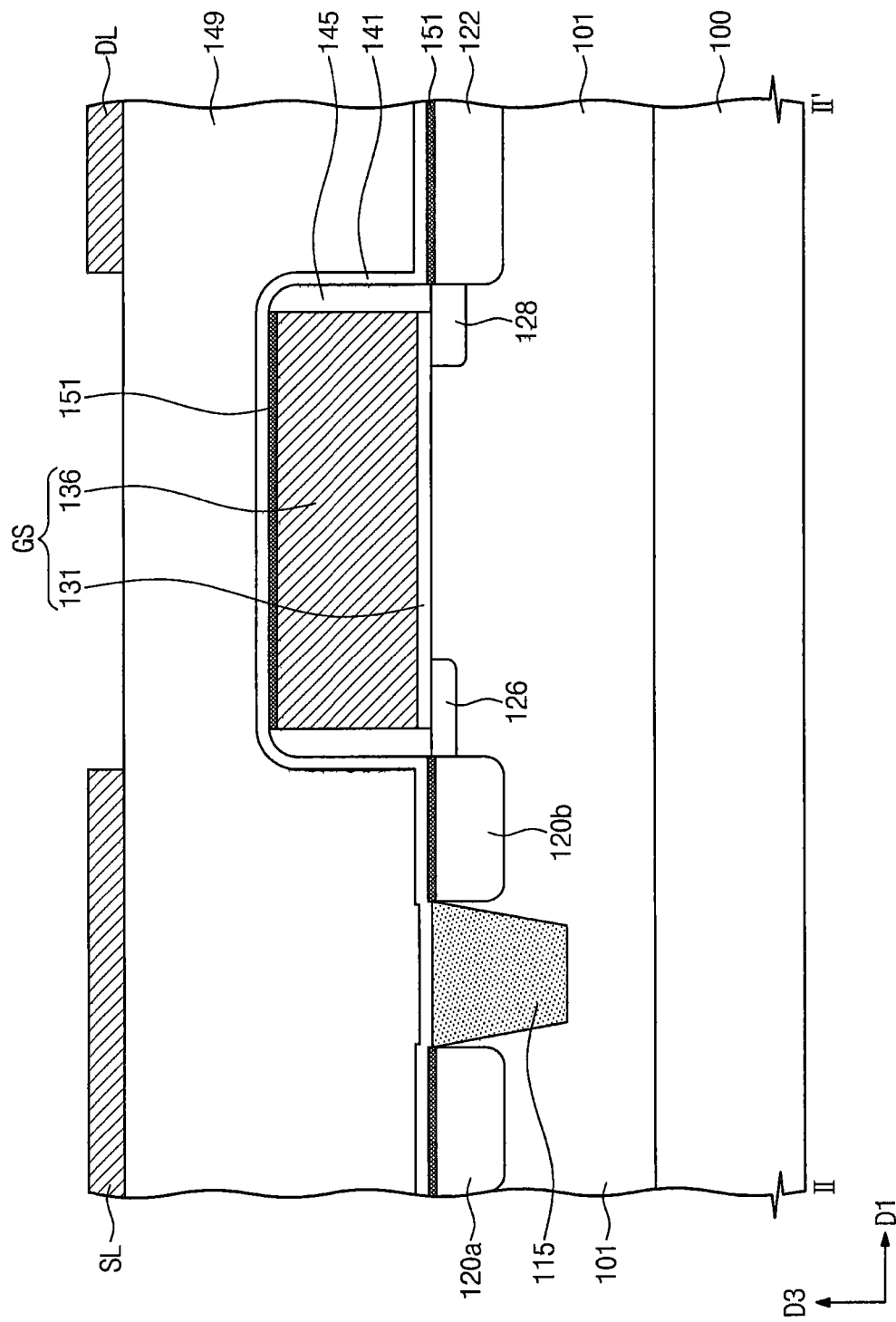

FIG. 12A is a schematic plan view of a semiconductor device according to some example embodiments of present inventive concepts. FIGS. 12B and 12C are sectional views, which illustrate vertical sections taken along lines I-I' and II-II', respectively, of FIG. 12A. In detail, FIGS. 12A through 12C may illustrate a high voltage transistor of a semiconductor device. Additionally or alternatively, the semiconductor device may include transistors different from the high voltage transistor. As an example, the high voltage transistor may be a P-MOS transistor. In the following description, an element previously described with reference to FIGS. 8A through 8D may be identified by a similar or identical reference number without repeating an overlapping description thereof, for the sake of brevity.

Referring to FIGS. 12A through 12C, each of source regions may include a first source region 120a and a second source region 120b. Each of the first and second source regions 120a and 120b may be a line-shaped structure extending along a second direction D2 parallel to a top surface of a substrate 100. An adjacent pair of the first and second source regions 120a and 120b may be spaced apart from each other in a first direction D1 crossing (e.g., intersecting) the second direction D2.

Well contact regions 124 and gapfill patterns 115 may be interposed between the first and second source regions 120a and 120b. The well contact regions 124 and the gapfill patterns 115 may be alternatingly disposed between a pair of the first source region 120a and the second source region 120b, along the second direction D2. In other words, an adjacent pair of the well contact regions 124 may be spaced apart from each other in the second direction D2, with the gapfill pattern 115 interposed therebetween. When viewed in plan view, a width (in the first direction D1) of each of the gapfill patterns 115 may be substantially the same as that of each of the well contact regions 124.

First contacts 161 may be provided through the interlayer insulating layer 149 and may be electrically connected to the first and second source regions 120a and 120b and the well contact regions 124. The first contacts 161 may overlap the well contact regions 124, when viewed in a plan view. In other words, the first contacts 161 may be disposed along the second direction D2. Second contacts 166 may be provided through the interlayer insulating layer 149 and may be electrically connected to drain regions 122. The second contacts 166 may also be disposed along the second direction D2.

Other features of the semiconductor device according to FIGS. 12A-12C may be substantially the same as that described with reference to FIGS. 8A through 8D.

Figure 13A:
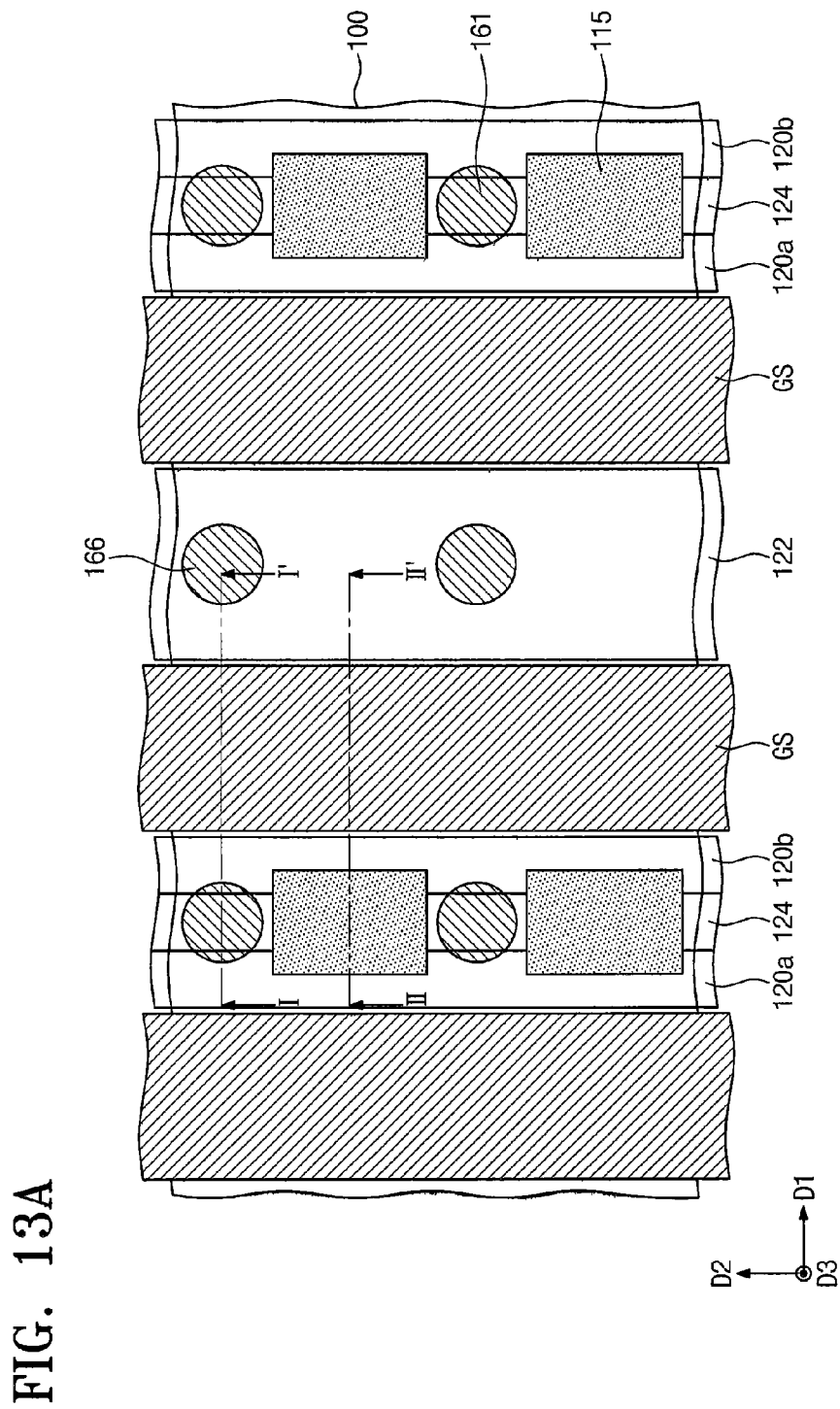
FIG. 13A is a schematic plan view of a semiconductor device according to some example embodiments of present inventive concepts.
Figure 13B:
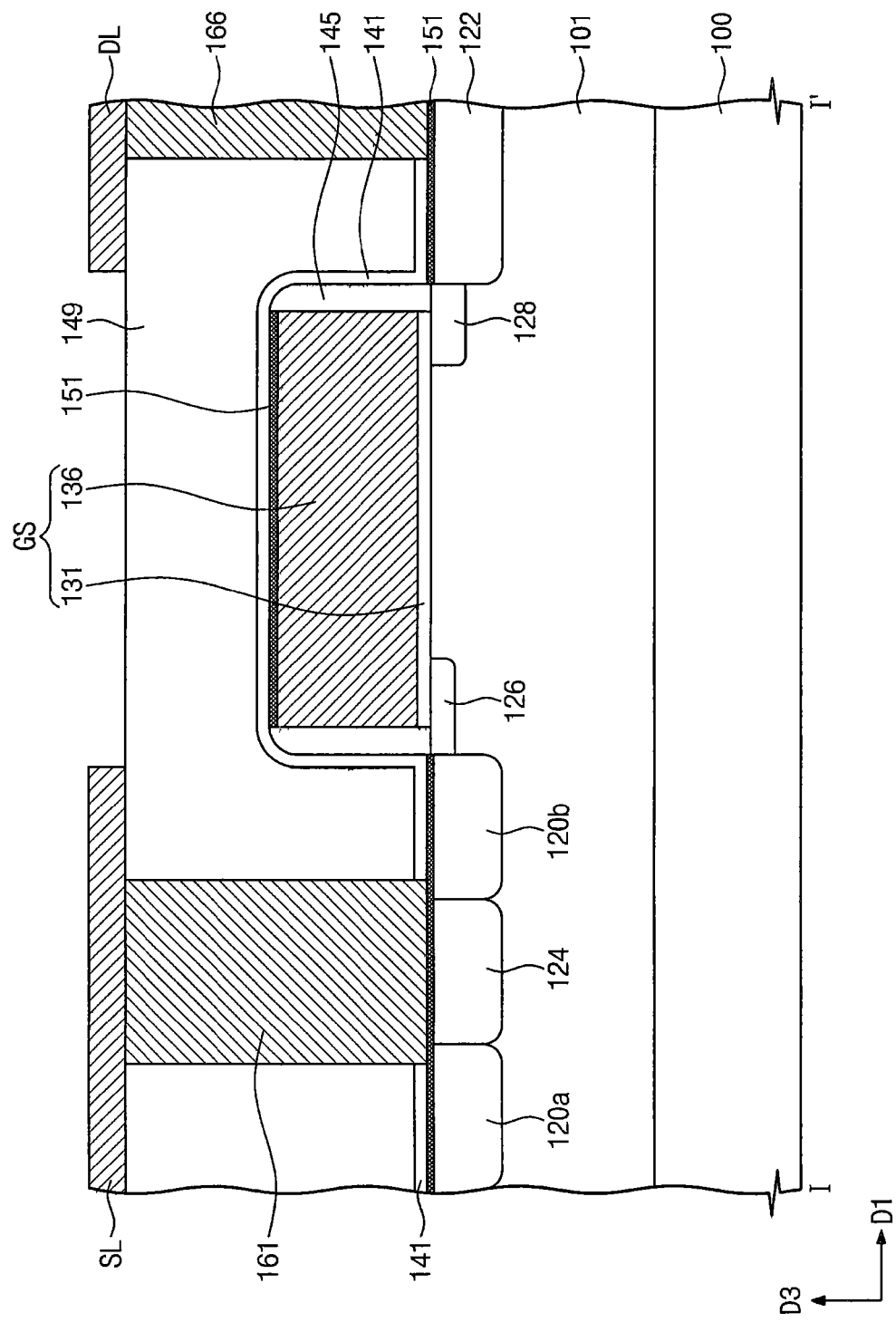
FIGS. 13B and 13C are sectional views, which illustrate vertical sections taken along lines I-I' and II-II', respectively, of FIG. 13A.
Figure 13C:
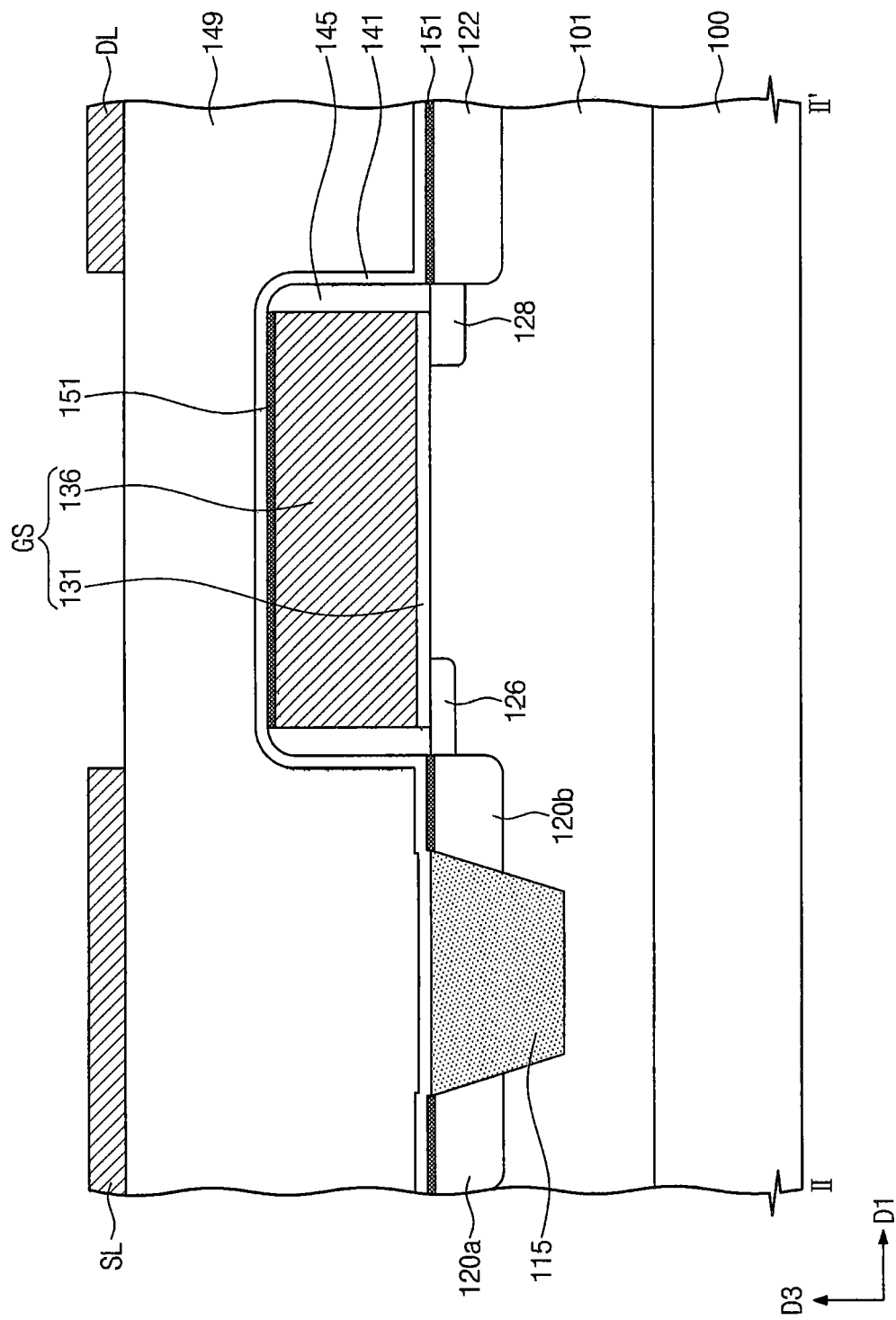

FIG. 13A is a schematic plan view of a semiconductor device according to some example embodiments of present inventive concepts. FIGS. 13B and 13C are sectional views, which illustrate vertical sections taken along lines I-I' and II-II', respectively, of FIG. 13A. In detail, FIGS. 13A through 13C may illustrate a high voltage transistor of a semiconductor device. Additionally or alternatively, the semiconductor device may include transistors different from the high voltage transistor. As an example, the high voltage transistor may be a P-MOS transistor. In the following description, an element previously described with reference to FIGS. 12A through 12C may be identified by a similar or identical reference number without repeating an overlapping description thereof, for the sake of brevity.

Referring to FIGS. 13A through 13C, when viewed in plan view, a width of each of the gapfill patterns 115 may be greater than that of each of the well contact regions 124. In other words, each of the gapfill patterns 115 may include a portion partially overlapping the first source region 120a or the second source region 120b. Other features of the semiconductor device according to FIGS. 13A-13C may be substantially the same as that described with reference to FIGS. 12A through 12C.

Figure 14A:
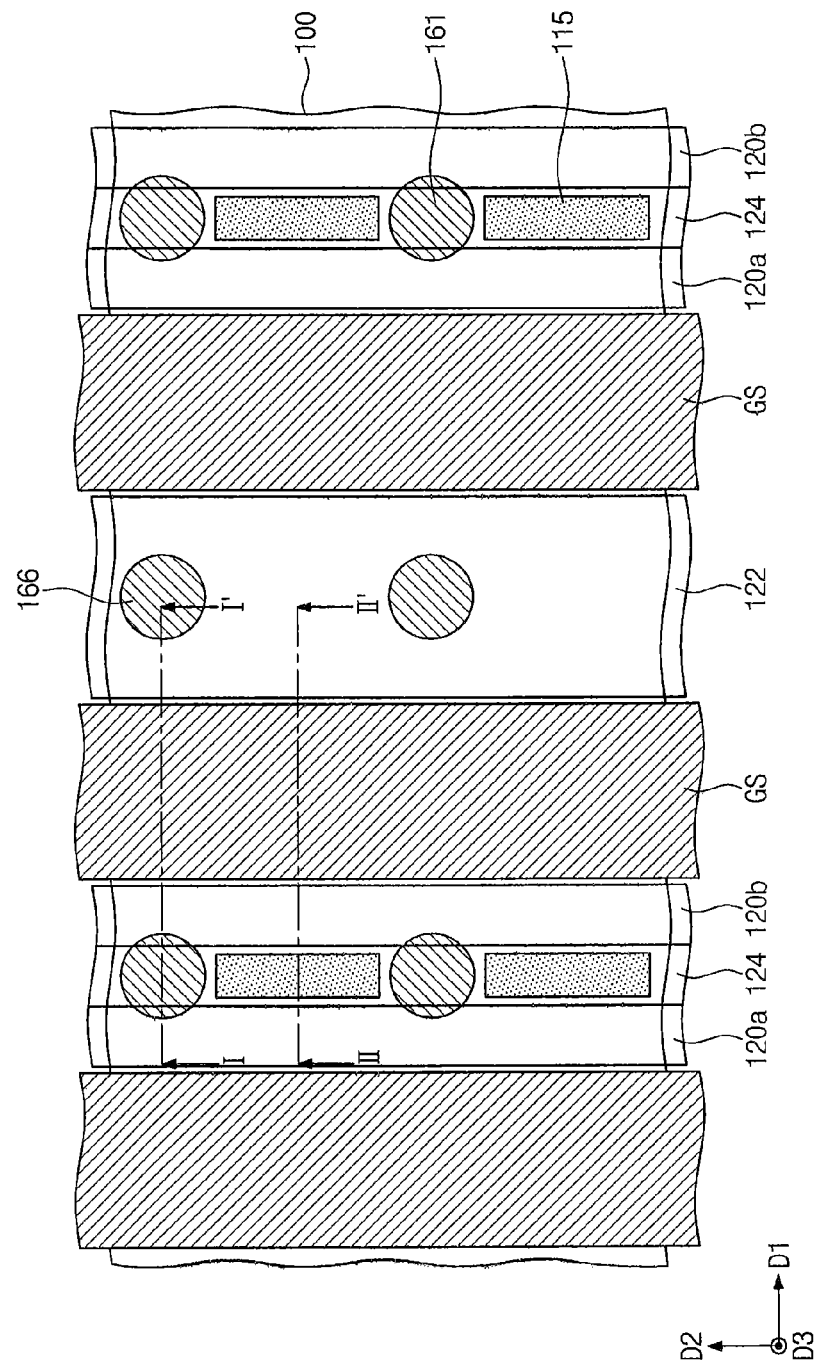
FIG. 14A is a schematic plan view of a semiconductor device according to some example embodiments of present inventive concepts.
Figure 14B:
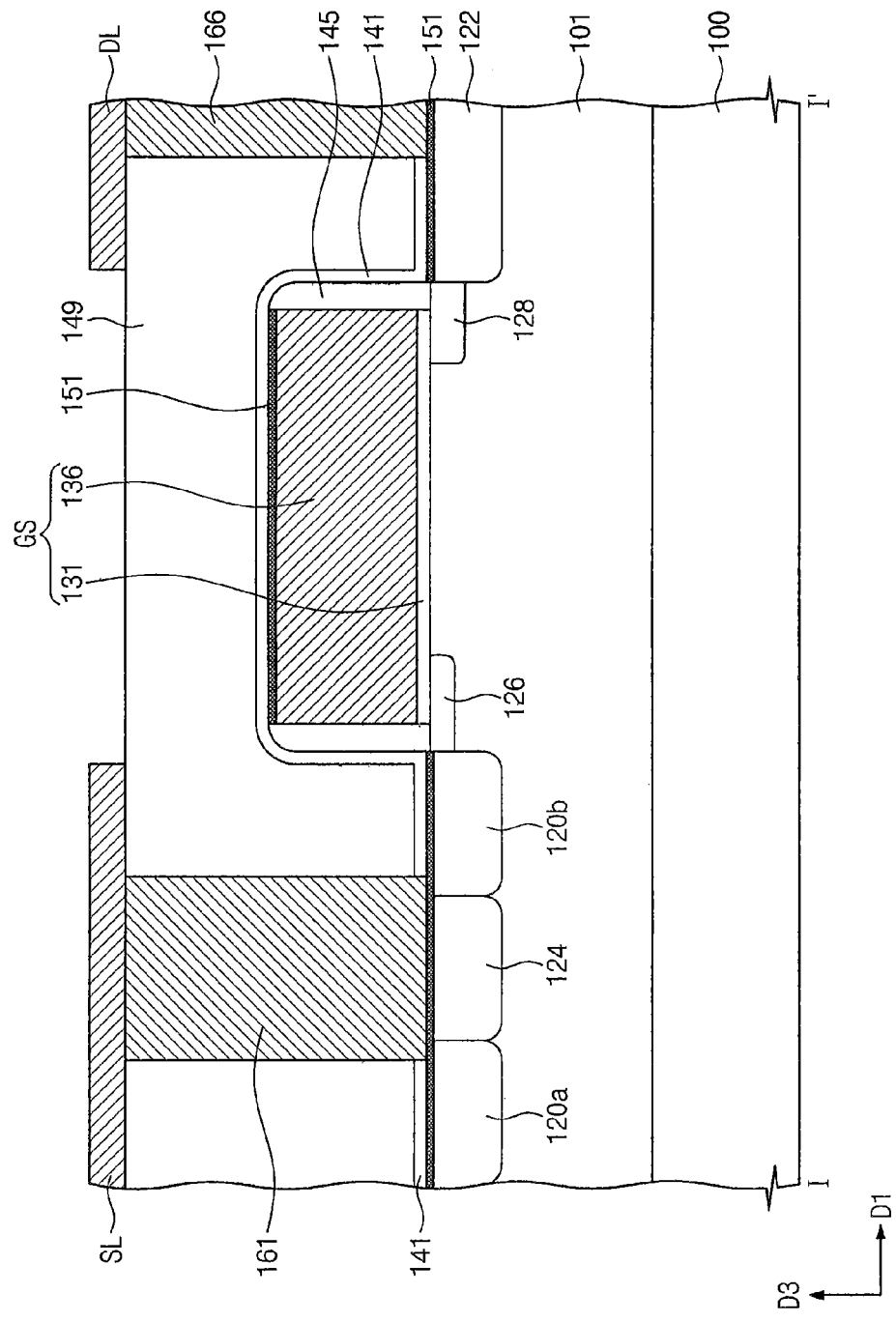
FIGS. 14B and 14C are sectional views, which illustrate vertical sections taken along lines I-I' and II-II', respectively, of FIG. 14A.
Figure 14C:
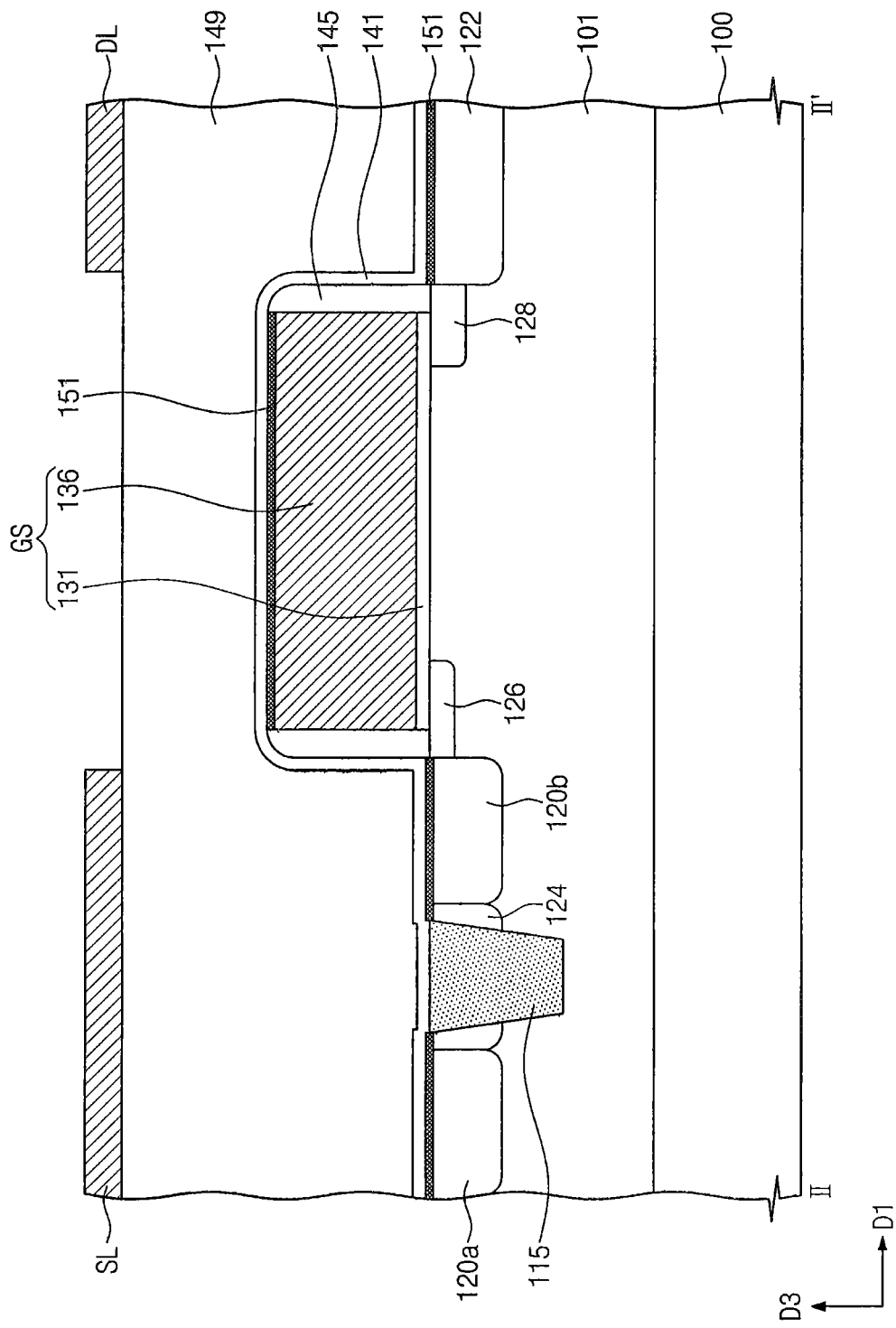

FIG. 14A is a schematic plan view of a semiconductor device according to some example embodiments of present inventive concepts. FIGS. 14B and 14C are sectional views, which illustrate vertical sections taken along lines I-I' and II-II', respectively, of FIG. 14A. In detail, FIGS. 14A through 14C may illustrate a high voltage transistor of a semiconductor device. Additionally or alternatively, the semiconductor device may include transistors different from the high voltage transistor. As an example, the high voltage transistor may be a P-MOS transistor. In the following description, an element previously described with reference to FIGS. 12A through 12C may be identified by a similar or identical reference number without repeating an overlapping description thereof, for the sake of brevity.

Referring to FIGS. 14A through 14C, one well contact region 124 may be interposed between an adjacent pair of the first source region 120a and the second source region 120b. The well contact region 124 may extend along a second direction D2 parallel to a top surface of a substrate 100. Gapfill patterns 115 may be arranged along the well contact region 124 or parallel to the second direction D2. When viewed in plan view, a width (in the first direction D1) of each of the gapfill patterns 115 may be smaller than that of each of the well contact regions 124. In other words, the gapfill patterns 115 may be enclosed by the well contact region 124. Other features of the semiconductor device according to FIGS. 14A-14C may be substantially the same as that described with reference to FIGS. 12A through 12C.

APPLICATION(S)

Figure 15:
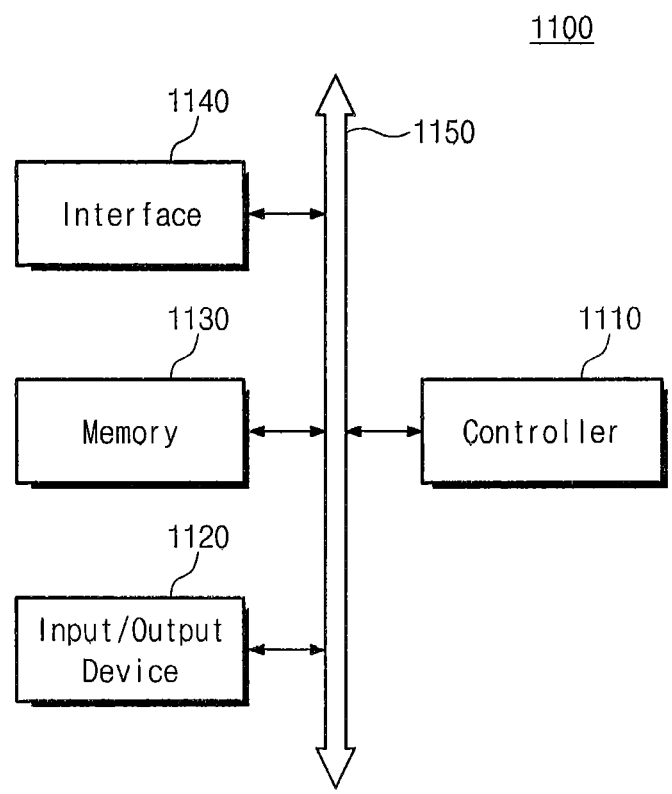
FIGS. 15 and 16 are block diagrams schematically illustrating examples of electronic devices including a semiconductor device according to some example embodiments of present inventive concepts.
Figure 16:
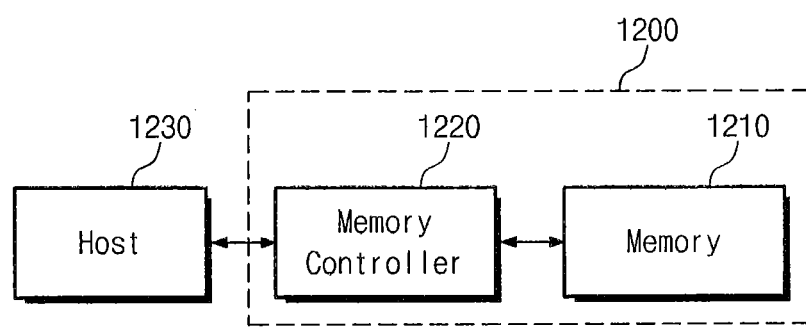

FIGS. 15 and 16 are block diagrams schematically illustrating examples of electronic devices including a semiconductor device according to some example embodiments of present inventive concepts.

Referring to FIG. 15, an electronic device 1100 including a semiconductor device according to some example embodiments of present inventive concepts may be one of a personal digital assistant (PDA), a laptop computer, a mobile computer, a web tablet, a wireless phone, a cell phone, a digital music player, a wired or wireless electronic device, or a complex electronic device including a combination of such functionalities. The electronic device 1100 may include a controller 1110, an input/output device(s) 1120 (such as a keypad, a keyboard, or a display), a memory 1130, and/or an interface 1140 that are connected/coupled to each other through a bus 1150. The controller 1110 may include, for example, at least one microprocessor, a digital signal process, a microcontroller, etc. The memory 1130 may be configured to store a command code to be used by the controller 1110 and/or user data. The electronic device 1100 may use the interface 1140 configured to transmit data to and/or receive data from a wireless communication network using a RF (radio frequency) signal. The interface 1140 may include, for example, an antenna, a wireless transceiver, etc. The controller 1110, the input/output device(s) 1120, the memory 1130, and/or the interface 1140 may be configured to include at least one of the semiconductor devices according to some example embodiments of present inventive concepts.

The electronic device 1100 may be used to realize a communication interface protocol of a communication system according to a standard such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, etc.

Referring to FIG. 16, a memory system including a semiconductor device according to some example embodiments of present inventive concepts will be described. The memory system 1200 may include a memory device 1210 for storing a relatively large amount of data and a memory controller 1220. The memory controller 1220 controls the memory device 1210 so as to read data stored in the memory device 1210 and/or to write data into the memory device 1210 in response to a read/write request of a host 1230. The memory controller 1220 may include an address mapping table for mapping an address provided from the host 1230 (e.g., a mobile device or a computer system) into a physical address of the memory device 1210. The memory device 1210 and/or the memory controller 1220 may include at least one of the semiconductor devices according to some example embodiments of present inventive concepts.

The semiconductor devices disclosed above may be encapsulated using various and diverse packaging techniques. For example, the semiconductor devices according to the aforementioned embodiments may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor device according to one of the above example embodiments is mounted may further include at least one semiconductor device (e.g., a controller and/or a logic device) that controls the semiconductor device.

According to some example embodiments of present inventive concepts, a semiconductor device may include gapfill patterns which are provided in a source region to exert a compressive stress on a channel region. The gapfill patterns may contribute to increase mobility of holes and reduce on-resistance of a transistor. In other words, the use of the gapfill patterns may make it possible to decrease on-resistance of a p-type high voltage transistor, without altering other electrical characteristics (e.g., breakdown voltage).

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:
1. A semiconductor device, comprising:
a substrate comprising a well region;
a gate electrode on the substrate;

source and drain regions in the substrate and comprising a first conductivity type opposite a second conductivity type of the well region, the source region being in the well region and the drain region being spaced apart from the source region, with the gate electrode between the source region and the drain region;

a plurality of gapfill patterns arranged along the source region and spaced apart from each other, when viewed in a plan view; and a well contact region in the well region and comprising the second conductivity type, wherein the well contact region directly contacts the source region.

2. The semiconductor device of claim 1, wherein the gapfill patterns are configured to exert a compressive stress on a channel region between the source and drain regions.

3. The semiconductor device of claim 1, wherein, when viewed in the plan view, each of the gapfill patterns is surrounded by the source region.

4. The semiconductor device of claim 1, wherein the well region is on a bottom surface, and portions of side surfaces, of each of the gapfill patterns.

5. The semiconductor device of claim 1, further comprising a drift region in the substrate and between the well region and the drain region,
wherein the drift region has the first conductivity type, and
wherein the drain region is enclosed by the drift region.

6. The semiconductor device of claim 5, further comprising an insulating isolation layer in the drift region and between the drain region and the well region.

7. The semiconductor device of claim 6, wherein the insulating isolation layer comprises a bottom surface overlapping the drift region.

8. The semiconductor device of claim 6, wherein the insulating isolation layer and the gapfill patterns comprise respective bottom surfaces that are substantially equidistant from a surface of the substrate.

9. The semiconductor device of claim 6, wherein the gate electrode partially overlaps the insulating isolation layer.

10. A semiconductor device, comprising:
a substrate comprising a well region;
a gate electrode on the substrate;
first and second source regions in the well region;
a drain region in the substrate and spaced apart from the first and second source regions, with the gate electrode between the drain region and the first and second source regions;
a well contact region in the well region and between the first and second source regions; and
a plurality of gapfill patterns spaced apart from each other adjacent the well contact region, when viewed in a plan view,
wherein the first and second source regions and the drain region comprise a first conductivity type different from a second conductivity type of the well region and the well contact region, and
wherein the well contact region directly contacts both of the first and second source regions.

11. The semiconductor device of claim 10, wherein the gapfill patterns are between the first and second source regions.

12. The semiconductor device of claim 10,
wherein the well contact region comprises a plurality of well contact regions, and
wherein when viewed in the plan view, the gapfill patterns and the well contact regions are alternatingly disposed between the first and second source regions.

13. The semiconductor device of claim 10, wherein at least one of the gapfill patterns partially overlaps the first or second source region, when viewed in the plan view.

14. The semiconductor device of claim 10, further comprising a drift region in the substrate and between the well region and the drain region,
wherein the drift region has the first conductivity type, and
wherein the drain region is enclosed by the drift region.

15. The semiconductor device of claim 14, further comprising an insulating isolation layer in the drift region and between the drain region and the well region.

16. A semiconductor device comprising:
a substrate comprising a well region and a drain region;
a source region in the well region;
a gate electrode that is between the source and drain regions, when viewed in a plan view; and
first and second patterns, in the source region, that are spaced apart from each other when viewed in the plan view, wherein:
the source and drain regions comprise p-type source and drain regions and the well region comprises an n-type well region;
the semiconductor device further comprises an n-type well contact region, in the n-type well region, that directly contacts the p-type source region; and
the first and second patterns are configured to exert a compressive stress on a channel region between the p-type source and drain regions.

17. The semiconductor device of claim 16, wherein respective perimeters of the first and second patterns are surrounded by the p-type source region and/or the n-type well contact region, when viewed in the plan view.

18. The semiconductor device of claim 16, further comprising:
a drift region between the well region and the drain region; and
an insulating isolation layer in the drift region and between the drain region and the well region.

19. The semiconductor device of claim 16,
wherein the source region comprises first and second source regions, and
wherein the first and second patterns are between the first and second source regions, when viewed in the plan view.

* * * * *